US005751637A

United States Patent [19]

Chen et al.

[11] Patent Number: 5,751,637
[45] Date of Patent: May 12, 1998

[54] AUTOMATIC PROGRAMMING ALGORITHM FOR PAGE MODE FLASH MEMORY WITH VARIABLE PROGRAMMING PULSE HEIGHT AND PULSE WIDTH

[75] Inventors: Chia Shing Chen, I-Lan County; Chun-Hsiung Hung, Hsin-Chu, both of Taiwan; Ray-Lin Wan, Milpitas, Calif.; Teruhiko Kamei, Yokohama, Japan

[73] Assignee: Macronix International Co., Ltd., Hsinchu, Taiwan

[21] Appl. No.: 605,003

[22] PCT Filed: Mar. 12, 1996

[86] PCT No.: PCT/US95/07376

§ 371 Date: Mar. 12, 1996

§ 102(e) Date: Jun. 7, 1995

[51] Int. Cl.$^6$ .................................................. C11C 13/00
[52] U.S. Cl. ........................ 365/185.33; 365/189.01; 365/189.07
[58] Field of Search ...................... 365/45, 189.01, 365/189.07, 168, 185.33

[56] References Cited

U.S. PATENT DOCUMENTS

| 4,258,378 | 3/1981 | Wall ................................ 357/41 |
| 4,451,904 | 5/1984 | Sugiura et al. ................. 365/182 |
| 4,639,893 | 1/1987 | Eitan ............................... 365/185 |
| 4,698,787 | 10/1987 | Mukherjee et al. ............ 365/185 |
| 4,780,424 | 10/1988 | Holler et al. ..................... 437/29 |
| 4,792,925 | 12/1988 | Corda et al. .................... 365/185 |
| 4,812,885 | 3/1989 | Riemenschneider ............ 357/23.5 |
| 4,947,378 | 8/1990 | Jinbo et al. ..................... 365/222 |
| 4,949,309 | 8/1990 | Rao et al. ........................ 365/218 |
| 4,972,378 | 11/1990 | Kitigawa et al. ............... 365/210 |
| 5,012,446 | 4/1991 | Bergemont ..................... 365/185 |
| 5,023,681 | 6/1991 | Ha .................................. 357/23.5 |
| 5,023,837 | 6/1991 | Schreck et al. ................. 365/185 |
| 5,028,979 | 7/1991 | Mazzali .......................... 357/45 |

(List continued on next page.)

FOREIGN PATENT DOCUMENTS

| 0298430A2 | 1/1989 | European Pat. Off. . |
| 0422347A2 | 9/1989 | European Pat. Off. . |
| 0354858A1 | 2/1990 | European Pat. Off. . |
| 0461764A2 | 6/1990 | European Pat. Off. . |
| 0386631A2 | 9/1990 | European Pat. Off. . |
| 0461764A3 | 12/1991 | European Pat. Off. . |
| 0552531A1 | 7/1993 | European Pat. Off. . |
| 2241380 | 11/1990 | United Kingdom . |

OTHER PUBLICATIONS

M. Inoue, et al., "A 16 Mb DRAM with an Open Bit Line Architecture" ISSCC Solid State Circuits Conference, San Francisco, Feb. 1988, pp. 246–248.

M. Okada, et al., "16 Mb ROM Design using Bank Select Architecture" IEEE Symposium on VLSI Circuits, Tokyo, 1988.

W. Kammerer, et al., "A New Virtual Ground Array Architecture for Very High Speed, High Density EPROMS", IEEE Symposium on VLSI Circuits, OISO, May 1991, pp. 83–84.

(List continued on next page.)

*Primary Examiner*—Terrell W. Fears
*Attorney, Agent, or Firm*—Wilson Sonsini Goodrich & Rosati

[57] ABSTRACT

A method for programming a flash memory array which insures fast programming to substantially all of the cells in the array, without over-programming, based on providing a pattern of program retry pulses which have respective pulse widths and pulse heights which vary according to a pattern. The pattern includes a combination of both increasing pulse widths and increasing pulse heights. The pattern includes a first phase which completes in a specified amount of time including a predetermined number of retries so that substantially all of the cells in the array are programmed within the first phase. A second phase of the patter involves a sequence of higher energy pulses addressed to programming the slowest cells in the array. When used in a page program array, in which individual cells which are programmed fast do not receive subsequent retry pulses, a very fast and reliable programming scheme is achieved.

24 Claims, 9 Drawing Sheets

U.S. PATENT DOCUMENTS

| | | |
|---|---|---|
| 5,045,489 | 9/1991 | Gill et al. ................................. 437/43 |
| 5,053,990 | 10/1991 | Kreifels et al. ......................... 364/900 |
| 5,060,195 | 10/1991 | Gill et al. ................................. 365/185 |
| 5,060,197 | 10/1991 | Park et al. ............................... 365/200 |
| 5,095,461 | 3/1992 | Miyakawa et al. ...................... 365/185 |
| 5,110,753 | 5/1992 | Gill et al. ................................. 437/52 |
| 5,111,428 | 5/1992 | Liang et al. ............................. 365/104 |
| 5,117,269 | 5/1992 | Bellezza et al. ....................... 357/23.5 |
| 5,121,353 | 6/1992 | Natori ..................................... 365/145 |
| 5,126,808 | 6/1992 | Montalvo et al. ..................... 357/23.5 |
| 5,127,739 | 7/1992 | Duvvury et al. .................. 365/189.11 |
| 5,168,335 | 12/1992 | D'Arrigo et al. ........................ 257/319 |
| 5,204,835 | 4/1993 | Eitan ....................................... 365/185 |
| 5,220,531 | 6/1993 | Blyth et al. ......................... 365/189.07 |
| 5,229,968 | 7/1993 | Ito et al. ................................. 365/210 |
| 5,243,559 | 9/1993 | Murai ..................................... 365/185 |
| 5,245,570 | 9/1993 | Fazio et al. ............................. 365/185 |
| 5,287,326 | 2/1994 | Hirata ................................. 365/230.03 |
| 5,297,081 | 3/1994 | Challa ..................................... 365/184 |
| 5,315,541 | 5/1994 | Harari et al. ............................... 365/63 |
| 5,345,416 | 9/1994 | Nakagawara ............................ 365/185 |
| 5,379,256 | 1/1995 | Tanaka et al. ........................... 365/185 |
| 5,394,362 | 2/1995 | Banks ................................. 365/189.01 |
| 5,399,891 | 3/1995 | Yiu et al. ................................. 257/316 |

OTHER PUBLICATIONS

Eitan, et al., "Alternate Metal Virtual Ground (AMG)—A New Scaling Concept for Very High–Density EPROM's"; IEEE Electron Device Letters, vol. 12, No. 8, Aug. 1991, pp. 450–452.

H. Pein, et al., "A 3–D Sidewall Flash EPROM Cell and Memory Array"; IEEE Electron Device Letters, vol. 14, No. 8, Aug. 1993, pp. 415–417.

H. Pein, et al. "Performance of the 3–D Sidewall Flash EPROM Cell"; IEEE, 1993, pp. 2.1.1—2.1.4.

S. Yamada, et al., "Degradation Mechanism of Flash EEPROM Programming After Program/Erase Cycles"; IEEE 1993, pp. 2.5.1.—2.5.4.

H. Kume, et al., "A 1.28 $\mu m^2$ Contactless Memory Cell Technology for a 3V–Only 64 Mbit EEPROM"; IEDM 1992, pp. 24.7.1—24.7.3.

A. Bergemont, et al., "NOR Virtual Ground (NVG)—A New Scaling Concept for Very High Density Flash EEPROM and its Implementation in a 0.5$\mu$m Process"; IEEE, 1993, pp. 2.2.1—2.2.4.

H. Onoda, et al., "A Novel Cell Structure Suitable for a 3 Volt Operation, Sector Erase and Flash Memory"; IEEE, 1992, pp. 24.3.1—24.3.4.

R. Kazerounian, et al., "Alternate Metal Virtual Ground EPROM Array Implemented in a 0.8$\mu$m Process for Very High Density Applications"; IEEE 1991, pp. 11.5.1–11.5.4.

N. Kodama, et al., "A Symmestrical Side Wall (SSW)–DSA Cell for a 64Mbit Flash Memory" IEEE 1991; pp. 11.3.1—11.3.4.

M. McConnell, et al., "An Experimental 4–Mb Flash EEPROM with Sector Erase" Journal of Solid Circuits, vol. 26, No. 4; IEEE 1991; pp.484–489.

B.J. Woo, et al., "A Novel Memory Cell Using Flash Array Contactless EPROM (FACE) Technology"; IEEE 1990; pp. 5.1.1—5.1.4.

B.J. Woo, et al., "A Poly–Buffered FACE Technology for High Density Flash Memories" Symposium on VLSI Technology, pp. 73–74.

AUTOMATIC PROGRAMMING ALGORITHM FOR PAGE MODE FLASH MEMORY WITH VARIABLE PROGRAMMING PULSE HEIGHT AND PULSE WIDTH

The present application is related to PCT Application No. PCT/US95/00077, filed 5 Jan. 1995 entitled ADVANCED PROGRAM VERIFY FOR PAGE MODE FLASH MEMORY, which is related to U.S. Pat. No. 5,526,307, which is a continuation-in-part of U.S. patent application Ser. No. 08/187,118, filed Jan. 25, 1994, now U.S. Pat. No. 5,399,891; which is a continuation of U.S. Application No. 07/823,882, filed Jan. 22, 1992 now abandoned.

BACKGROUND OF THE INVENTION

1. Field of the Invention

The present invention relates to flash EEPROM memory technology, and more particularly to an improved flash EEPROM memory architecture for automatic programming with controlled programming voltages for improved efficiency and speed.

2. Description of Related Art

Flash EEPROMs are a growing class of non-volatile storage integrated circuits. The memory cells in a flash EEPROM are formed using so-called floating gate transistors in which the data is stored in a cell by charging or discharging the floating gate. The floating gate is a conductive material, typically made of polysilicon, which is insulated from the channel of the transistor by a thin layer of oxide, or other insulating material, and insulated from the control gate of the transistor by a second layer of insulating material.

The floating gate may be charged through a Fowler-Nordheim tunneling mechanism by establishing a large positive voltage between the gate and source or drain. This causes electrons to be injected into the floating gate through the thin insulator. Alternatively, an avalanche injection mechanism, known as hot electron injection, may be used by applying potentials to induce high energy electrons in the channel of the cell which are injected across the insulator to the floating gate. When the floating gate is charged, the threshold voltage for causing the memory cell to conduct is increased above the voltage applied to the word line during a read operation. Thus, when a charged cell is addressed during a read operation, the cell does not conduct. The non-conducting state of the cell can be interpreted as a binary 1 or 0 depending on the polarity of the sensing circuitry.

The floating gate is discharged to establish the opposite memory state. This function is typically carried out by an F-N tunneling mechanism between the floating gate and the source or the drain of the transistor, or between the floating gate and the substrate. For instance, the floating gate may be discharged through the drain by establishing a large positive voltage from the drain to the gate, while the source is left at a floating potential.

The high voltages used to charge and discharge the floating gate place significant design restrictions on flash memory devices, particularly as the cell dimensions and process specifications are reduced in size.

Furthermore, the act of charging and discharging the floating gate, particularly when using the F-N tunneling mechanism, is a relatively slow process that can restrict the application of flash memory devices in certain speed sensitive applications.

In state of the art floating gate memory architectures using sub-micron technology, the critical dimension variation in patterns on the physical material is usually controlled within about 10%. For a flash EEPROM cell, or other floating gate memory, such variation in critical dimensions may result in a variation in programming speed to the second order, using the Fowler Nordheim tunneling method. Further, if deviation in bias voltages in the array are considered, the variation in programming speed may vary by the fourth order in state of the art devices.

The conventional method to program flash memory uses a fixed pulse width and fixed bias, with a program verification loop executed after each programming pulse. If the verify fails, then another pulse is applied in an iterative fashion. If the programming pulses have too much energy, then over-programmed cells will result. If the pulses have too little energy, then an insufficient number of cells will be programmed in the first cycle. An over-programmed cell results in moving too much charge out of the floating gate of the device such that it falls outside of the specified operation for the array. This may result in coding errors. Thus, algorithms must be careful to avoid over-programming, while making sure that it does not take too long to program a particular byte in the memory. When the range in programming speed for cells in a memory array varies by two to four orders of magnitude, it can be appreciated that the problem of over-programming, or requiring too many programming pulses, can be quite significant. This has slowed down the operation of prior art flash memory devices.

One prior approach to increasing the programming speed while avoiding over-programming of quickly programmed cells involves incrementally increasing the pulse height of each successive retry pulse. This approach achieves fast programming, provided the steps in pulse height are substantial. However, it also requires complicated circuitry to implement. Furthermore, the increased pulse heights of the later pulses in the sequence cause an increasing disturbance of cells not being programmed.

Another alternative involves rather than increasing the pulse height, simply increasing the pulse width of successive pulses in the retry path. This technique does not cause the increasing disturbance problem of the increase pulse height algorithm, but results in an intolerable programming time, and relatively complicated circuitry to implement all the various pulse widths.

Accordingly, it is desirable therefore to provide a flash EEPROM cell architecture and method for programming the cells, which overcome the speed penalties and over-programming failures of the prior art.

SUMMARY OF THE INVENTION

The present invention provides a method and apparatus for programming a flash memory array which insures fast programming to substantially all of the cells in the array, without over-programming. The invention is based on providing a pattern of program retry pulses which have respective pulse widths and pulse heights which vary according to a pattern. The pattern includes a first phase which completes in a specified amount of time including a predetermined number of retries so that substantially all of the cells in the array are programmed within the first phase. A second phase of the pattern involves a sequence of higher energy pulses addressed to programming the slowest cells in the array. The pattern comprises a combination of increasing pulse widths and increasing pulse heights. When used in a page program array, in which individual cells which are programmed easily, do not receive subsequent pulses, a very fast and reliable programming scheme is achieved, significantly improving over the prior art approaches.

Accordingly, the present invention can be characterized as a method for programming a floating gate memory cell which includes applying a first program pulse to the cell having a first pulse height and first pulse width selected so that the cell is unlikely to be over-programmed. Next, the algorithm determines whether the cell is programmed in response to the first program pulse; and if not, applies a program retry pulse to the cell. After the program retry pulse, the algorithm determines whether the cell is programmed in response to that pulse, and if not, iteratively applies another program retry pulse to the cell and determines whether the cell is programmed until the cell is determined to be programmed or a maximum number of retries is made. The program retry pulses have respective pulse width and pulse heights which vary according to a pattern including at least one pulse have a pulse width wider than the first pulse width and a pulse height higher than the first pulse height. The pattern is selected so that the cell is likely to be programmed within a first phase of the pattern including a predetermined number of retries less than the maximum number of retries.

According to one aspect of the invention, the retry pulses in the pattern have respective energies determined by their respective pulse heights and pulse widths which successively remain constant or increase during the first phase of the pattern, and have an energy during the second phase of the pattern which is at least as great as the last pulse in first phase of the pattern.

According to another aspect of the invention, it can be characterized as a method for storing data in a memory array on an integrated circuit having a plurality of rows and columns of floating gate memory cells. The method involves loading a page buffer on the integrated circuit with a row of input data (setting bits which are to receive program pulses to a program value) and selecting a row of memory cells for programming the input data to the row. The program retry pattern described above is applied to the cells in the row of memory cells which correspond to input data having a program value in the page buffer. After each verify sequence, the input data for each bit which passes verify in the page buffer is reset to a do not program value. After resetting the bits in the page buffer which pass verify, the next retry pulse is applied only to cells which did not pass.

In this way, a page of data may be loaded into a row including over five hundred cells, and in one aspect of the invention more than one thousand cells. The first phase of the program retry pattern according to this aspect is completed in less than one millisecond. For a one thousand cell row, this provides for a one microsecond per cell programming interval. According to the present invention, the first phase of the pattern mentioned above is designed to be completed in less than one millisecond, and many pages will complete in substantially less than one millisecond. Thus, for those pages which have slow cells which require the pattern to extend into the second phase, the overall average programming speed of the device is maintained by the present invention which ensures that most rows will complete successful programming in less than one millisecond.

The present invention is particularly useful in the page programmed architecture with automatic bit by bit verify according to the present invention. It provides for efficient, fast programming of a flash memory device in a fully automatic algorithm that does not require host intervention.

Other aspects and advantages of the present invention can be seen upon review of the figures, the detailed description, and the claims which follow.

DETAILED DESCRIPTION

Figure 1:
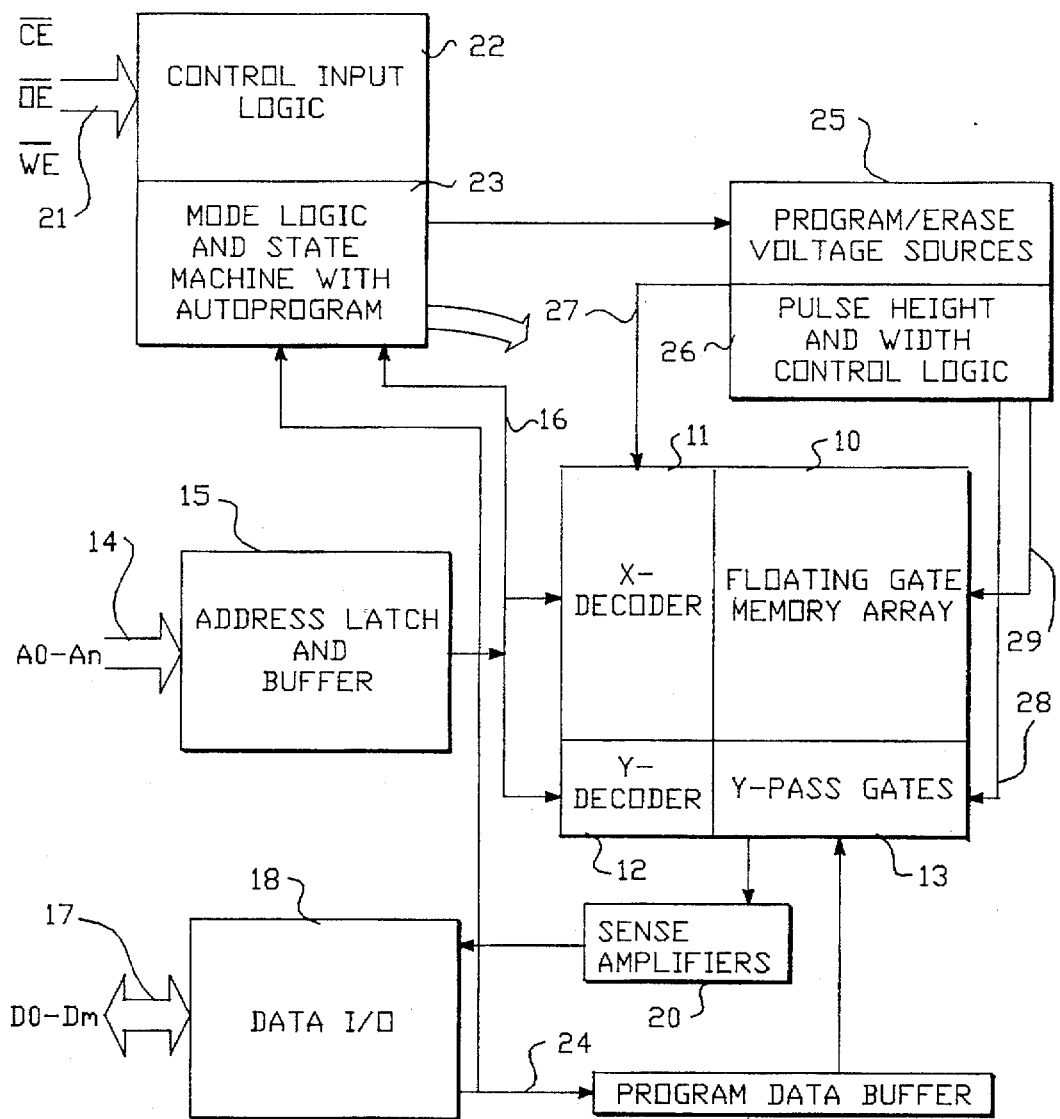
FIG. 1 is a schematic diagram of a floating gate integrated circuit memory according to the present invention, with automatic programming using variable pulse widths and pulse heights.

A detailed description of preferred embodiments of the present invention is provided with respect to the figures, in which FIG. 1 provides a conceptual overview of a floating gate memory device using an automatic programming algorithm with pulse height and width control logic. Thus the integrated circuit shown in FIG. 1 includes a floating gate memory array 10, such as a flash memory or EEPROM. Coupled to the array 10 are an x-decoder 11, a y-decoder 12, and y-dimension pass gates 13 which provide access to the bit lines of the array. The y-decoder selects particular bit lines in the array, while the x-decoder 11 selects particular word lines. Address signals are supplied on the input pins, generally 14, to an address latch and buffer 15. The address latch and buffer 15 drives lines 16, which are coupled to the x-decoder 11 and the y-decoder 12. Data signals are supplied through input/output pins 17 to data input/output circuitry 18. The data input/output circuitry 18 supplies input data through a program data buffer 19 and the y-pass gates 13 into the array. Output data from the array is supplied through the y-pass gates 13 to sense amplifiers 20, and from the sense amplifiers through the data input/output circuitry 18. Other inputs to the device include control signals including chip enable-CE, output enable OE, and write enable WE supplied on pins 21. These signals are coupled to control input logic 22 which is combined with mode logic and state machine 23. The state machine according to the present invention includes an auto program algorithm as discussed in more detail below.

The mode logic is responsive to commands received through the address and data lines 14 and 17. Thus, the output of the data I/O circuitry on line 24 is coupled not only to the program data buffer 19, but also to the mode logic and state machine 23. Also, address signals from line 16 are coupled also to the mode logic and state machine 23.

According to one embodiment of the invention, the floating gate memory array 10 consists of flash EEPROM cells which may be erased and programmed. In order to accomplish these processes, program and erase voltage sources 25 are included which provide high positive or negative voltages to the array for the purposes of programming and erasing the floating gate cells. According to the present invention, pulse height and width control logic 26 is included used during the automatic program sequence of the chip, for the purposes of ensuring efficient, rapid programming of cells in the array, without over-programming. The program and erase voltage sources 25, under control of the pulse height and width control logic 26, are coupled on line 27 through x-decoder 11 to the word lines in the floating gate memory array 10, across line 28 through the y-pass gates 13 on to the bit lines of the array, and to array source voltage nodes across line 29.

A negative charge pump is used in the program voltage sources 25 of FIG. 1 to drive the word lines of the arrays as mentioned above.

The implementation for the charge pump, and representative circuitry which may be used for the voltage divider is described in copending patent application entitled SERIES CAPACITOR CHARGE PUMP; Application No.: PCT/US/03069; filed 9 Mar. 1995, which is incorporated by reference as if fully set forth herein.

The block diagram of FIG. 1 is intended to represent a complete integrated circuit memory device improved according to the present invention with the automatic program algorithm using the pulse height and width control logic 26. Thus, further details concerning the implementation of the chip control structures and memory architectures with which the present invention may be used, can be determined by reference to commercial integrated circuits.

According to the present invention, the programming algorithm is improved for the floating gate memory array 10 using pulse height and width control logic. In a preferred system, the programming process involves discharging the floating gate in floating gate cells as is described with reference to FIG. 2.

Figure 2:
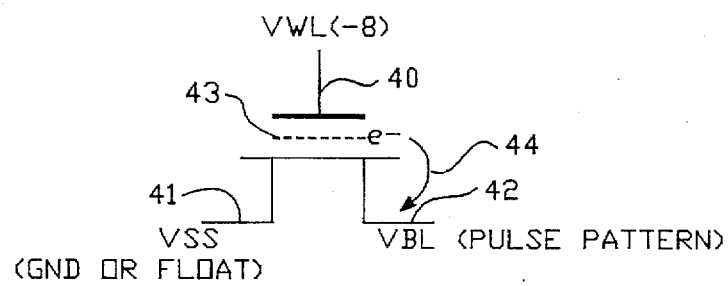
FIG. 2 is a simplified illustration of a floating gate memory cell for the purpose of describing program operation.

FIG. 2 is a schematic diagram of a floating gate memory cell which includes a control gate 40, a source 41, a drain 42, and a floating gate 43. During programming, the control gate according to the present invention of a cell to be programmed is coupled to a word line which receives the word line voltage of −8 volts. The source terminal 41 is coupled to the array reference voltage VSS which is coupled to ground or floating during the program operation. The drain 42 is coupled to a bit line which receives a pulse pattern according to the present invention for automatic programming of the cell. The pulse pattern provides a positive pulse in the range of 5.5 to 6.5 volts in one embodiment of the invention, which results in a process known as Fowler-Nordheim tunneling of electrons from the floating gate to the drain as indicated by arrow 44. As electrons are removed from the floating gate 43, the turn on threshold of the floating gate cell is reduced. Thus, in a floating gate memory array 10 using a discharged floating gate as the programmed state, a selected cell will be conductive in response to the read voltage pulling down the bit line to which it is connected when it is selected. In alternative systems, the reverse state can be utilized as the programmed state, involving charging up the floating gate so that its threshold is increased. When the increased threshold is used as the programmed state for the floating gate memory array, the cell is not conductive when it is accessed and does not pull down the corresponding bit line.

Figure 3:
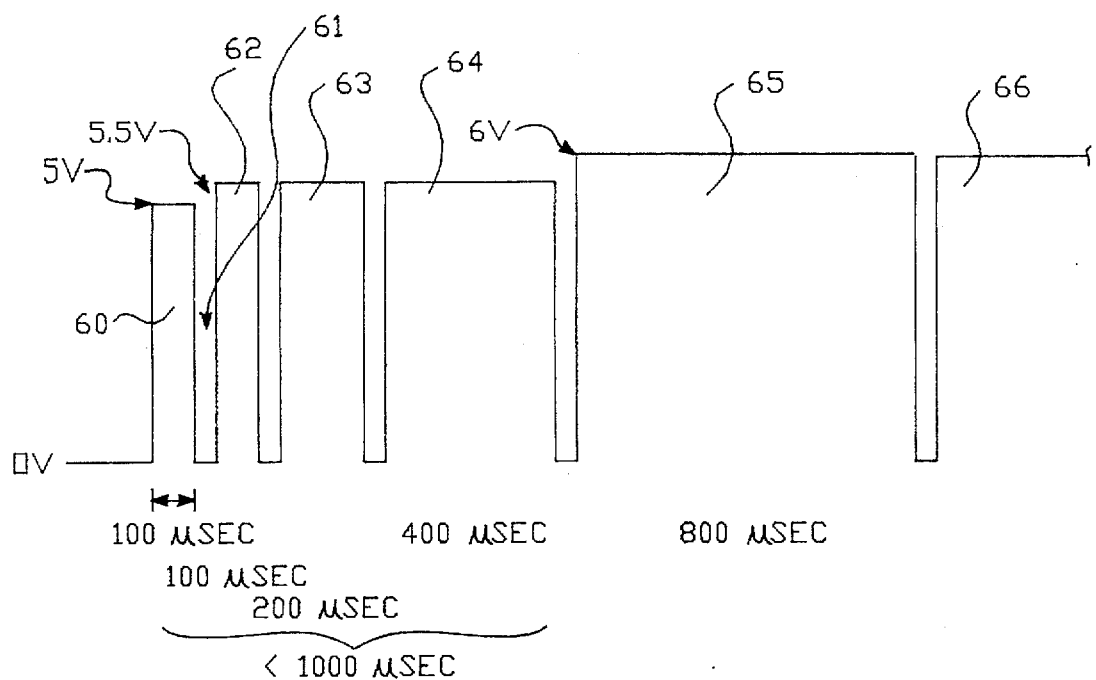
FIG. 3 illustrates a retry pulse pattern in which the pulse shapes vary in width and in height during the pattern.

As mentioned above, a pulse pattern is applied to the drain 42 of the floating gate cell being programmed according to the present invention. A representative pulse pattern is shown in FIG. 3. Thus, according to the embodiment of FIG. 3, the control gate of the cell being programmed is set to −8 volts while the drain receives a sequence of one or more program pulses in order to program the cell. A first program pulse 60 is applied to the drain of the floating gate cell to be programmed. The first program pulse has a pulse width of 100 microseconds and a pulse height of 5 volts. After the first pulse 60, a program verify operation is executed in the interval 61. If the cell passes the verify test executed during the interval 61, then no further pulses are applied to the cell. However, if it does not pass verify, then a program retry pulse 62 is applied to the drain. In the embodiment shown in FIG. 3, the pulse width of the program retry pulse 62 is 100 microseconds and the pulse height is 5.5 volts. Thus, the pulse height is increased but not the pulse width in the second pulse in the sequence. As before, after the second pulse, a verify algorithm is executed. If the cell passes, then no further pulses are applied. If the cell does not pass, then a second retry pulse 63 is applied. The second retry pulse has a pulse width of 200 microseconds in this example and a pulse height of 5.5 volts. Thus, the pulse energy is increased by doubling the width of the pulse relative to the first retry pulse 62, but not increasing the pulse height. If after the second retry pulse 63, the verify algorithm is not successful, then a third retry pulse 64 is applied. The third retry pulse 64 has a pulse width of 400 microseconds and a pulse width of 5.5 volts. Thus, the pulse energy is doubled again, relative to the second retry pulse 63 by doubling the width. However, the pulse height is not increased at this stage. After the third retry pulse 64, a verify algorithm is executed. If the cell still does not pass verify, then a fourth retry pulse 65 is applied to the drain. The fourth retry pulse has a pulse height of 6 volts and a pulse width of 800 microseconds. Thus, the fourth is twice as wide as the third retry pulse 64, and also has a higher pulse height. Again, a verify loop is executed after the fourth retry pulse. If the cell does not pass verify, then a sequence of additional retry pulses, such as pulse 66, is executed until the cell passes, or a maximum number of retries is executed. According to one embodiment, the retry pulses after pulse 65 are all 800 microseconds wide and 6 volts high. A sequence of eight of these 800 microsecond pulses is applied. If the cell does not pass after these eight 800 microsecond pulses, then an error is indicated.

As illustrated in FIG. 3, the pulse retry pattern includes a first phase which is less than 1000 microseconds wide, and a second phase. The pattern is selected so that substantially all of the cells in the array are expected to be programmed within the first phase, so that the average programming speed for cells in the array is determined by providing the width of the first phase (1000 microseconds in this example), by the number of cells programmed in parallel during the programming cycle. The occasional cell that is not programmed during the first phase, will require a longer program cycle for that particular cell. However, the average programming speed for the entire array will be maintained within the specification determined by the length of the first phase of the programming cycle.

In addition, the programming cycles during the first phase are designed to prevent over-programming of "fast" cells, while ensuring programming of "slow" cells during the first phase. Thus, the first program pulse 60 is designed so that it is unlikely that any particular cell receiving that pulse will be over-programmed. This results in many cells in the arrays not passing verify during the first verify algorithm 61. Similarly, the retry pulse 62 has slightly increased energy relative to the first pulse 60, and is selected so that cells which did not pass verify after the first pulse are unlikely to be over-programmed by the second pulse. As can be seen in FIG. 3, the retry pulses during the first phase all increase in energy, either by increasing the height of the pulse, or by increasing the width of the pulse. A combination involving increasing both pulse height and pulse width may be used as suits the needs of a particular cell architecture. The present invention relies on the realization that an increase in pulse height has greater impact on programming speed than an increase in pulse width which is equivalent in terms of an integral of pulse height over pulse width. For example, in one embodiment of the architecture shown in FIG. 8 below, programming speed increases by about an order of magnitude for each 2 volt increase in magnitude of wordline voltage, and for every 1.2 volt increase in magnitude of bit line bias the programming speed increases by about an order of magnitude. However, an increase in the time scale alone requires an order of magnitude wider pulse for about 2 volts lower Vt at a given pulse height.

As explained in more detail below, the pulse height and width control according to the present invention provide substantially improved performance over prior art systems.

Figure 4:
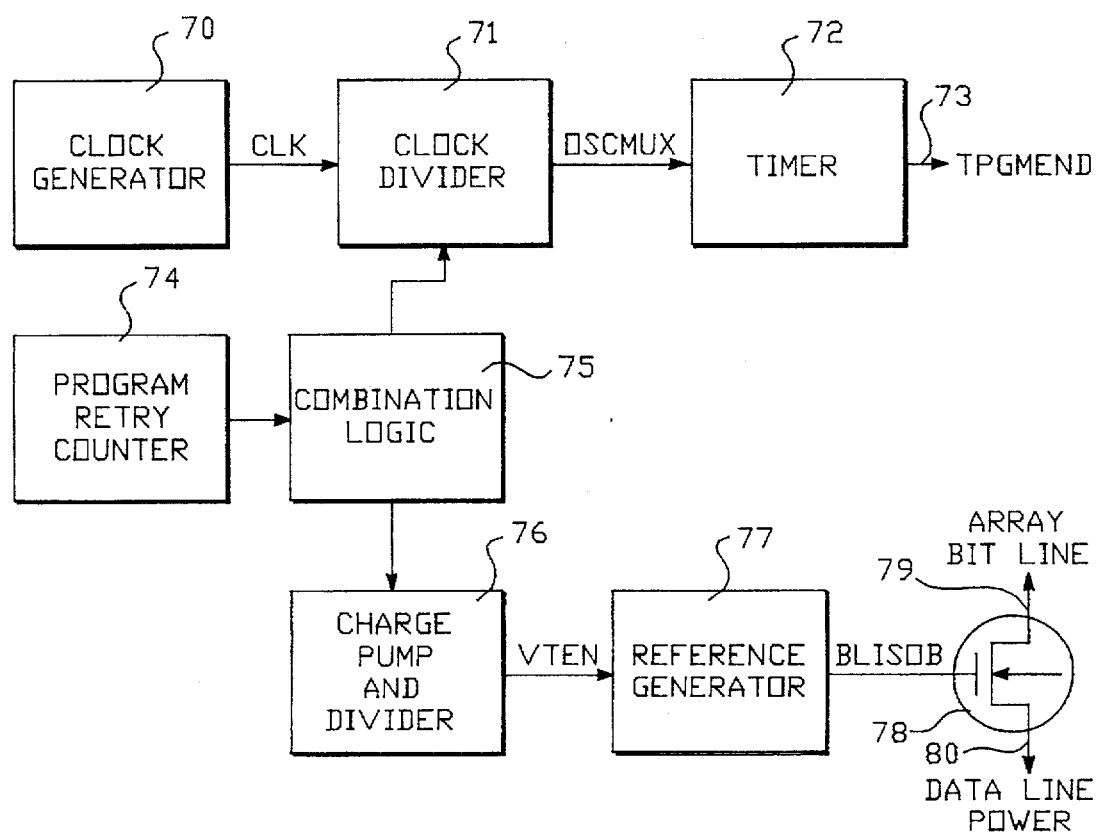
FIG. 4 is a block diagram of the logic used for generating the retry pulse pattern according to the present invention.

FIG. 4 illustrates pulse height and width control logic used with the program and erase voltage sources 25 of the present invention. This control logic includes a clock generator 70 which supplies a clock signal CLK to a clock divider 71. The output of the clock divider 71 is a set of control signals OSCMUX coupled to a timer 72 which supplies the timing signal for the programming pulses on line 73. A program retry counter 74 is included in the logic which supplies the retry number or pulse number to combinational logic 75. Combinational logic 75 supplies control signals to the clock divider 71 which specifies the pulse width of each pulse. The combinational logic 75 also drives a charge pump and divider 76 which supplies the positive voltage for the drain. This divider supplies a voltage control signal VTEN to a reference generator 77. The reference generator 77 supplies a reference voltage BLISOB to a control transistor 78 coupled to the bit lines in the array on line 79. The other side of transistor 70 is coupled to the data line power signal 80. The level of the pulse is defined by the signal BLISOB at the gate of transistor 78. This signal is set to be a threshold voltage above the desired pulse height. The data line power on line 80 is set above the maximum pulse height, and held constant by the charge pump in the system.

Figure 10:
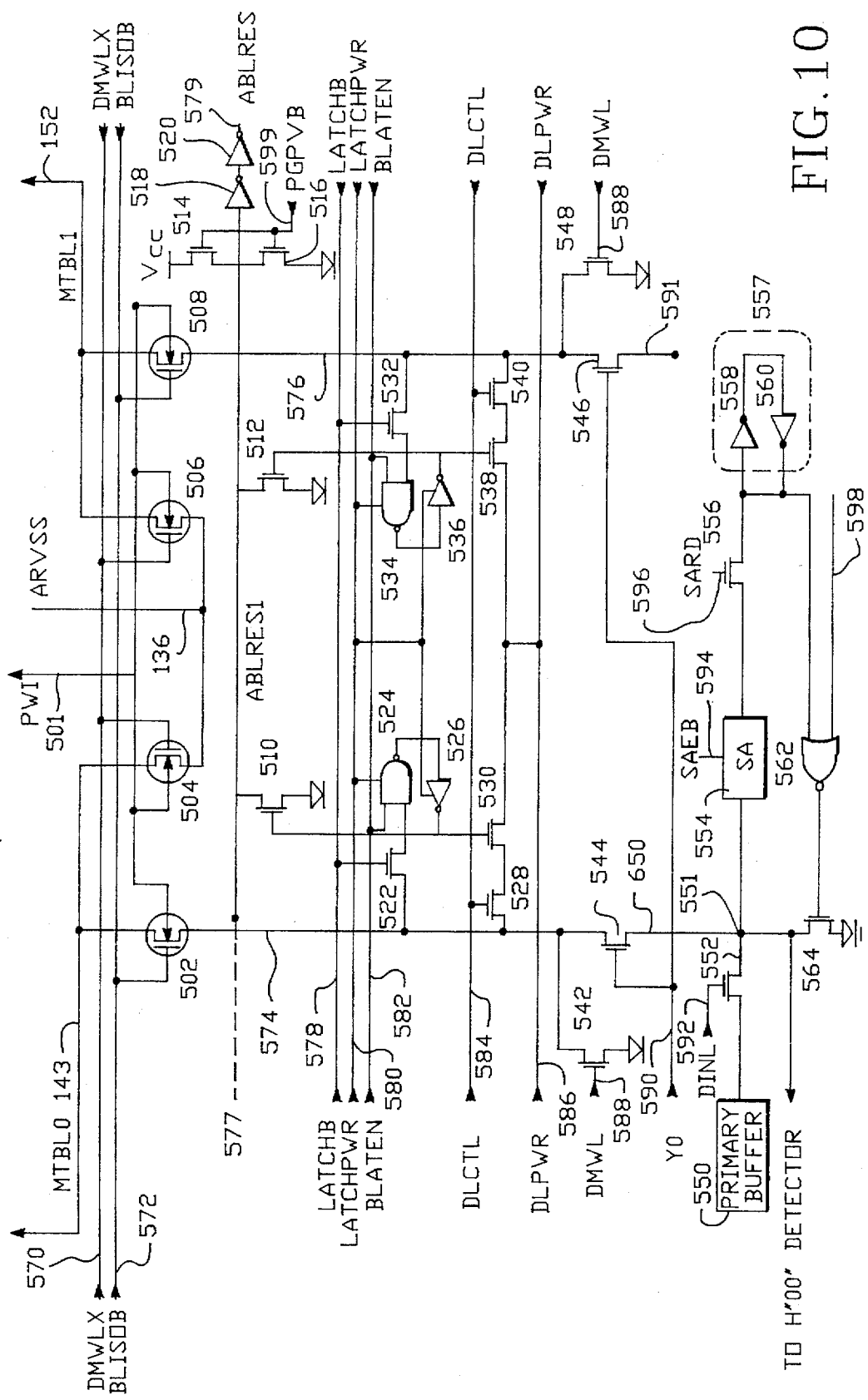
FIG. 10 is a schematic diagram showing a section of the page program and automatic verify circuit for two memory cells in the flash EEPROM array.

The preferred implementation of the input/output circuitry which drives the programming voltages to the array according to the present invention is shown in FIG. 10 below. Transistor 78 of FIG. 4 corresponds to transistors 502 and 508 of FIG. 10. The array bit line 79 of FIG. 4 corresponds to the metal bit lines 143 and 152 of FIG. 10. The data line power on line 80 of FIG. 4 corresponds to the lines 574 and 576 of FIG. 10, which receive power from the signal DLPWR on line 586 through transistors 528 and 530, and 538 and 540 respectively. The control signal TPGMEND on line 73 is used to control the timing of control signals BLISOB, DLCTL, and DMWL of FIG. 10. The programming pulse is ended by driving DLCTL to zero volts, which disconnects the signal DLPWR on line 586 from the line 574, and at the same time driving DMWL high which pulls the data line 574 to zero volts to end the programming pulse. At the same time, the BLISOB signal supplied by the reference generator 77 of FIG. 4 is switched to VCC, in preparation for the program verify sequence.

Figure 5:
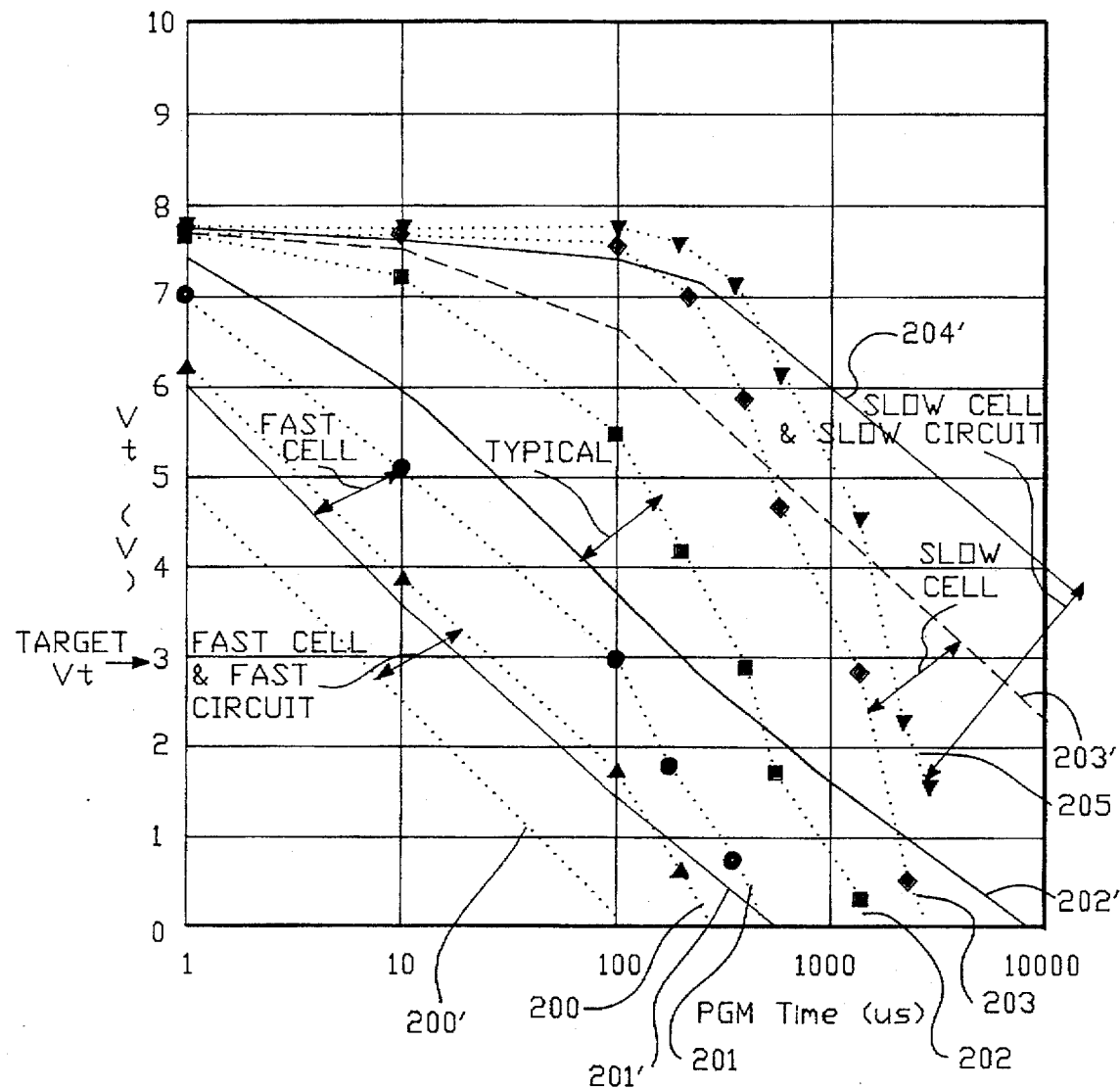
FIG. 5 is a graph comparing the approach of using an increasing pulse width alone, with the approach of the present invention using a variable pulse height and pulse width.
Figure 6:
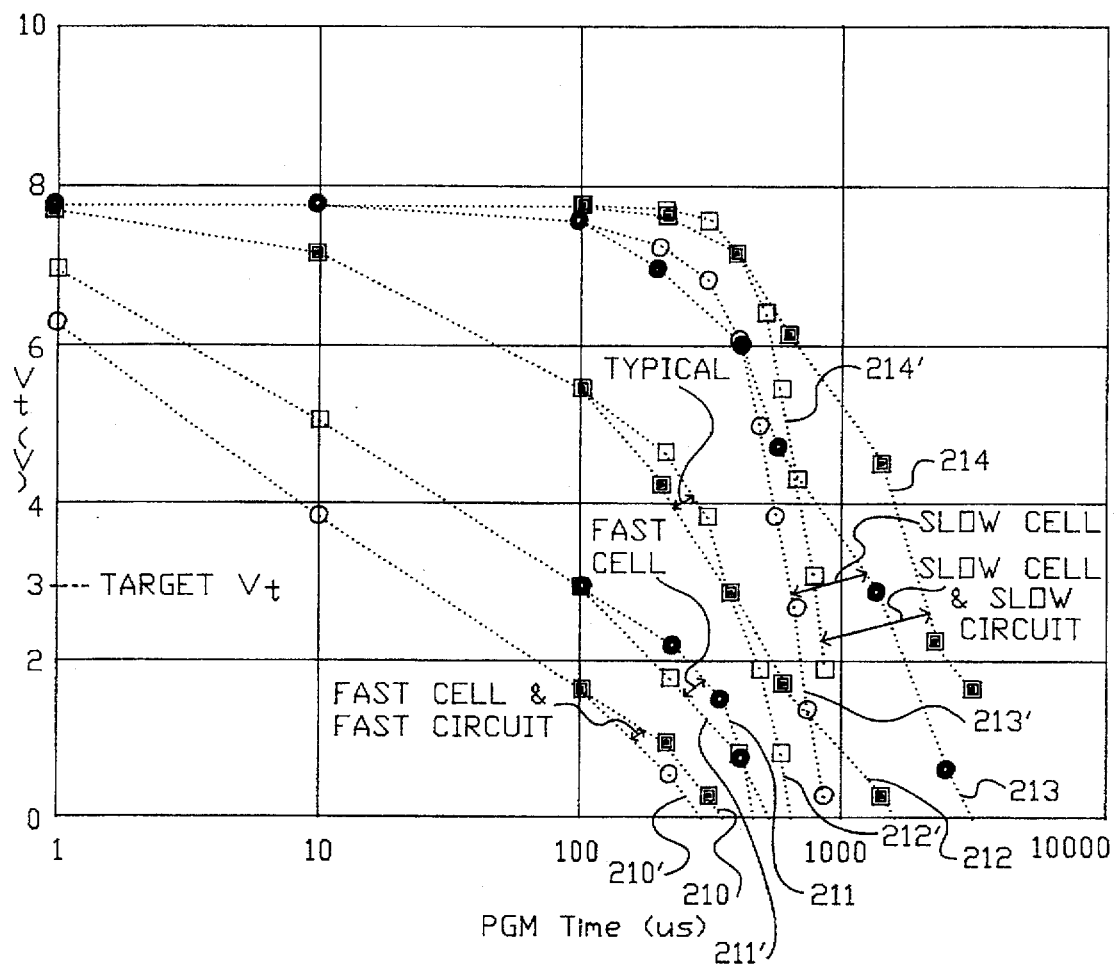
FIG. 6 is a graph illustrating the performance of increasing the pulse height alone, versus the approach of the present invention of increasing the pulse height and pulse width.
Figure 7:
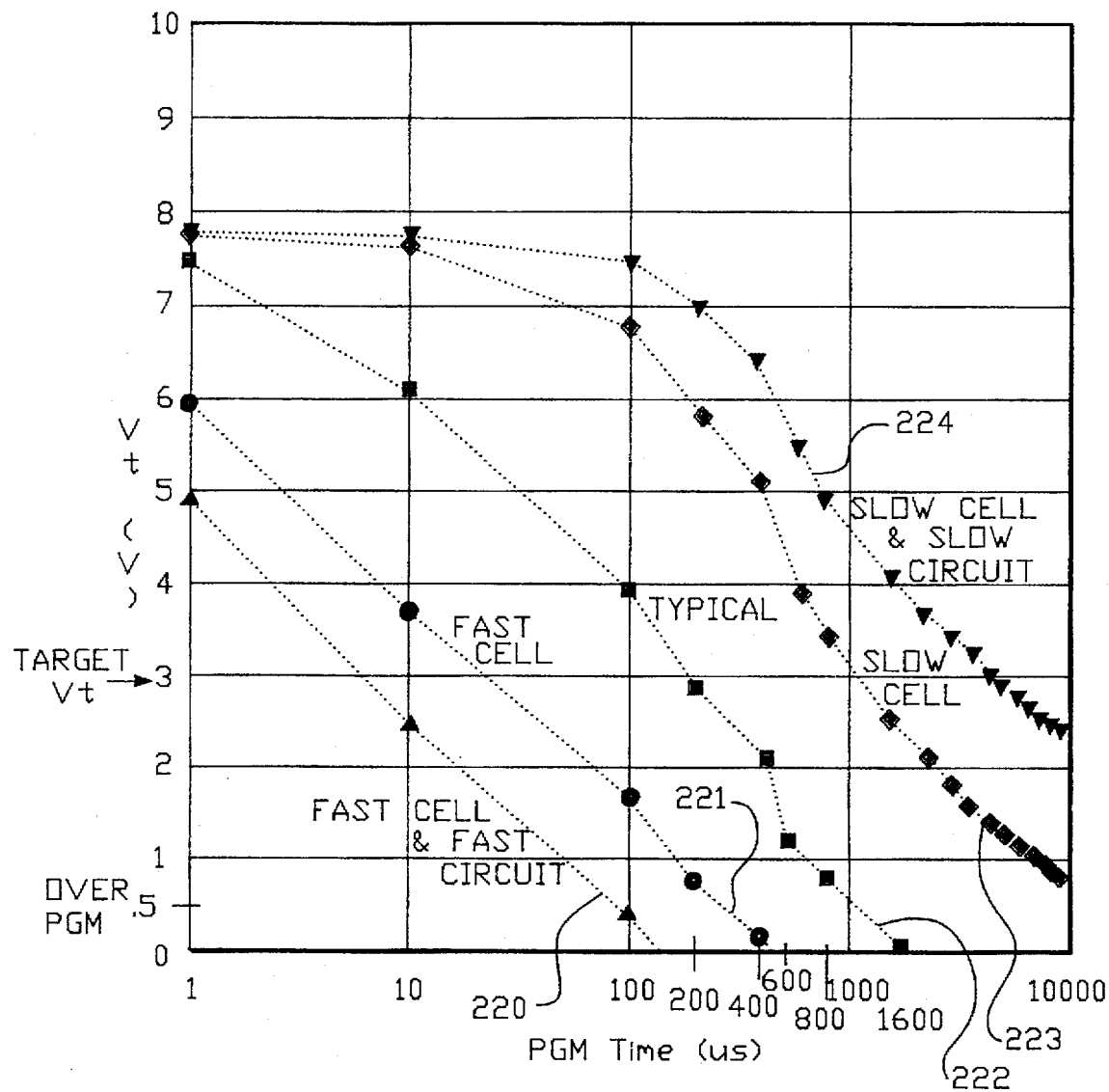
FIG. 7 is a graph illustrating the performance of a preferred approach to the present invention using the architecture shown in FIGS. 8–11.

FIGS. 5–7 are graphs illustrating the improvement in performance provided by the controlled pulse height and pulse width autoprogram algorithm according to the present invention. First, FIG. 5 provides a comparison between the prior art algorithm in which only pulse width is varied, and the present invention in which both pulse height and pulse width is varied. The pulse width and pulse height pattern used has been selected so that the energies are roughly equivalent between the successive pulses.

Along the horizontal axis is programming time in microseconds in logarithmic scale. Along the vertical axis is the resulting threshold voltage for the cell. The charts show simulation of a continuous program pulse. This represents the sequence of pulses without the verify intervals in between. Also, the target program VT is selected at about 3 volts. An overprogram condition is considered to exist when VT reaches about 0.5 volts.

The performance is charted for five cell conditions. The first cell condition shown on trace 200 for varied pulse height and width, and on trace 200' for varied width only is for a cell which programs quickly, and has a "fast circuit". By fast circuit, it is meant that the bias on the bit line coupled to this cell is higher (about one half volt in this example) than the normal bias on the array. This results in a very fast programming cell which may occur occasionally in modern high density architectures. The second condition on trace 201, using the algorithm of the present invention, and on trace 201' for varied pulse width only, is for a cell which programs quickly with normal bias. The third condition on trace 202 and trace 202' is provided for a typical cell in the array. The fourth condition on traces 203 and 203' illustrates the programming performance of a slow cell in the array. The last condition on traces 205 and 205' illustrates the programming performance of a cell in the array which programs slowly and is coupled to a "slow circuit". By slow circuit, it is meant that the bit line receives a lower voltage (by about one half volt in this example) than the normal bit line in the array.

The varied pulse height and pulse width conditions for the chart in FIG. 5 are set forth in Table 1 below.

TABLE 1

| Pulse Width | Pulse Height | Retry |
|---|---|---|
| 100 μs | 5.0/−8 volts | 1 |
| 100 μs | 5.6/−8 volts | 1 |
| 200 μs | 5.9/−8 volts | 1 |
| 200 μs | 6.5/−8 volts | 1 |
| 800 μs | 6.7/−8 volts | 1 |
| 800 μs | 7.5/−8 volts | 2 |

The lines for varied pulse width algorithm assumes a constant drain voltage of 6 volts in a gate voltage of −8 volts. Thus it can be seen that the pulse height starts lower (5 volts/−8 volts) in the pulse height/pulse width algorithm used for this comparison, than does the pulse height (6 volts/−8 volts) of the varied pulse width algorithm. It also ends up with a higher pulse height (6.5 to 7.5 volts/−8 volts) for the last four pulses in the sequence.

It can be seen for the fast cell with a fast circuit the varied pulse width algorithm 200' results in much faster programming (higher initial pulse height), and more danger of over-programming than does the varied pulse width and pulse height algorithm 200 of the present invention.

The performance of the typical cell (202, 202') is similar, with the algorithm of the present invention programming slightly more slowly. For the slow cell in array (203, 203'), it can be seen that the varied pulse height and pulse width algorithm results in a programmed cell much more quickly than the slow cell using just the varied pulse width. For the cell with both a slow programming characteristic and a slow circuit (204, 204'), the prior art approach of varying only the pulse width is unacceptably slow, and will result in many dye being discarded as unworkable.

FIG. 6 is a graph comparing the performance of varied pulse height only versus varied width and pulse height according to the present invention. As before, the horizontal axis is program time on a logarithmic scale. The vertical axis is the resulting threshold voltage.

The algorithm for varied pulse height and pulse width used for this comparison is also set forth in Table 1. For the varied pulse height algorithm, each pulse is 100 microseconds wide, the drain voltage is varied from 5 volts to 7.4 volts in 0.3 volt steps, and the gate voltage is varied from −8 volts to −11.2 volts in 0.4 volt steps. The varied pulse height/pulse width algorithm for the fast cell for fast circuit shown on trace 210, trace 211 shows the performance of the fast cell, trace 212 shows the performance of the typical cell, trace 213 shows the performance of the slow cell. Trace 214 shows the performance of the slow cell with the slow circuit. The corresponding traces for the varied pulse height only algorithm include trace 210' for the fast cell and fast circuit, trace 211' for the fast circuit, trace 212' for the typical cell, trace 213' for the slow cell, and trace 214' for the slow cell with the slow circuit.

It can be seen that the varied pulse height only algorithm is capable of programming even in the slow cell and slow circuit (214') relatively quickly. However, the voltage range used to provide this result requires very high voltages on the word line and/or drain. These very high voltages increase the risk of disturbing cells not to be programmed. Toward the end of the cycle in this example, the word line requires about −11 volts. Even when the drain of an unselected cell is grounded, this creates a substantial field on the unselected cell. This can be appreciated when it is understood that the first pulse in this varied pulse height algorithm creates a field of −13 volts which is very close to the voltage on the word line for the later pulses in the stream. Further, the pulse height algorithm requires more complicated circuitry to implement than does the varied pulse height and pulse width algorithm according to the present invention. The program cycle speed performance of the varied pulse height and pulse width algorithm is still quite good, even compared to the increasing pulse height algorithm using very high voltages as shown in FIG. 6.

FIG. 7 shows the performance of another example of varied pulse width and pulse height algorithm according to the present invention. The pattern according to this embodiment is shown in Table 2.

TABLE 2

| Pulse Width | Pulse Height | Retry Number |
| --- | --- | --- |
| 100 μs | 5.3 V/−8.0 V | 1 |
| 100 μs | 5.7 V/−8.0 V | 1 |
| 200 μs | 5.7 V/−8.0 V | 1 |
| 200 μs | 6.3 V/−8.0 V | 1 |
| 200 μs | 6.3 V/−8.0 V | 1 |
| 800 μs | 6.3 V/−8.0 V | 11 |

The horizontal axis in FIG. 7 provides program time on logarithmic scale in microseconds. The vertical axis shows resulting threshold voltage with a target threshold at 3 volts, and an over-program specification at 0.5 volts. Using the pattern shown in Table 2, the fast cell on a fast circuit is shown on trace 220 will not reach the over-program threshold after the first pulse. The fast cell shown on trace 221 will be significantly above the over-program threshold. The typical cell shown on trace 222 will not yet be programmed (VT not below 3 volts) by the first 100 microsecond pulse. However, after the second 100 microsecond pulse, the typical cell is programmed below the target VT of 3 volts but not over-programmed. The slow cell shown on trace 223 crosses the VT threshold of 3 volts very close to the 1000 microsecond target. The slow cell with the slow circuit shown on trace 224 does not reach the target VT threshold until about 5,000 microseconds.

The varied pulse height and pulse width algorithm can be adjusted as suits the needs of a particular implementation to improve the performance of a slow cell, and reduce the likelihood of over-programming, while maintaining the average overall programming speed at an optimum value which is faster, easier to implement, and less likely to cause disturbance of neighboring cells than prior art systems.

Figure 8:
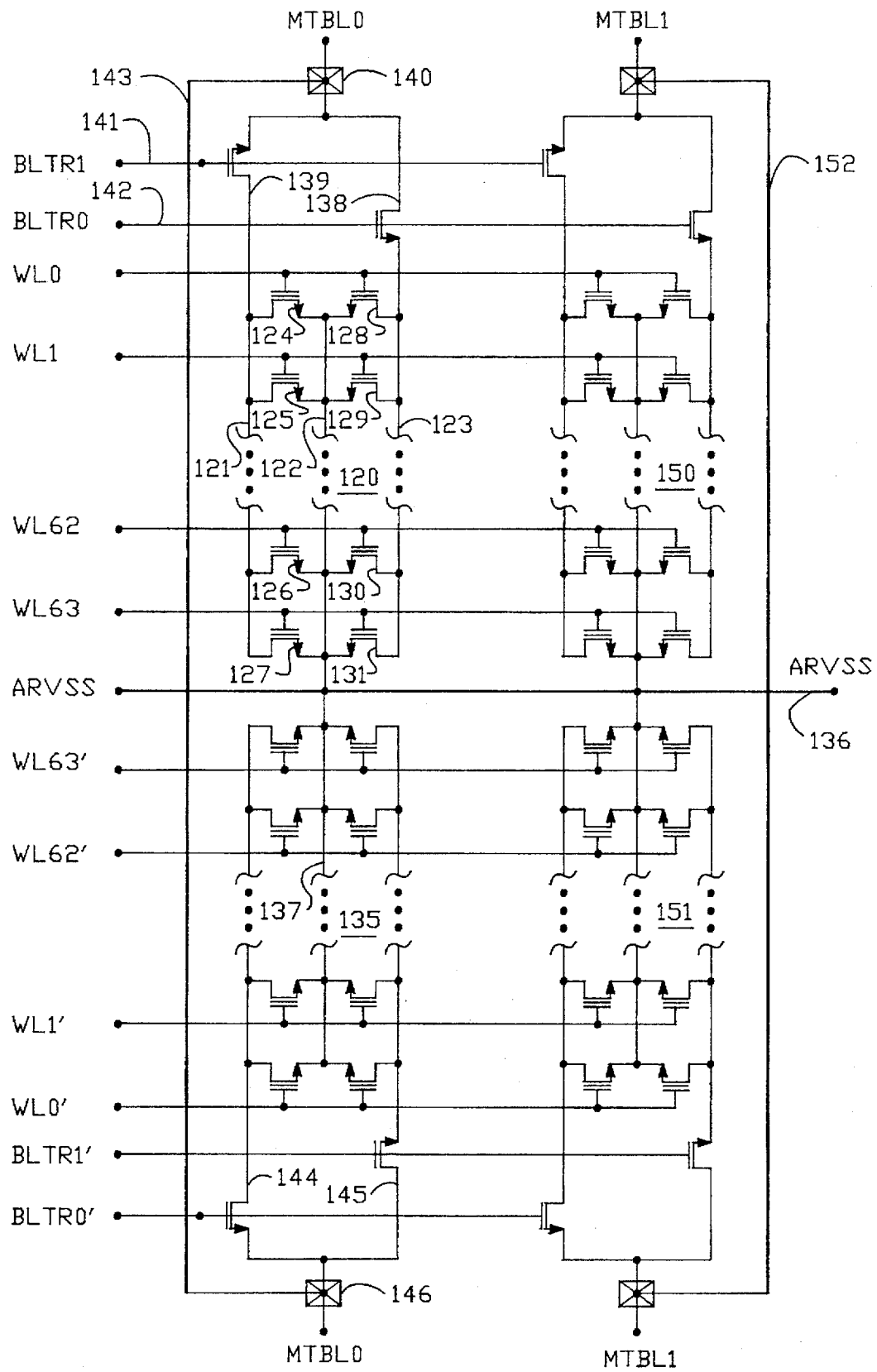
FIG. 8 is a schematic diagram of an array of flash EEPROM cells used with the present invention.

FIG. 8 illustrates an architecture of the flash EEPROM array according to one embodiment of the present invention, in which two columns of flash EEPROM cells share a single metal bit line. FIG. 8 shows four pairs of columns of the array, where each pair of columns includes flash EEPROM cells in a drain-source-drain configuration.

Thus, the first pair 120 of columns includes a first drain diffusion line 121, a source diffusion line 122, and a second drain diffusion line 123. Word lines WL0 through WL63 each overlay the floating gates of a cell in a first one of the pairs of columns and a cell in the second one of the pairs of columns. As shown in the figure, a first pair 120 of columns includes one column including cell 124, cell 125, cell 126, and cell 127. Not shown are cells coupled to word lines WL2 through WL61. The second one of the pair 120 of columns includes cell 128, cell 129, cell 130, and cell 131. Along the same column of the array, a second pair 135 of columns is shown. It has a similar architecture to the pair 120 of columns except that it is laid out in a mirror image.

Thus, as can be seen, the transistor in the first one of the pair of columns, such as the cell 125, includes a drain in the drain diffusion line 121, and a source in the source diffusion line 122. A floating gate overlays the channel region between the first drain diffusion line 121 and the source diffusion line 122. The word line WL1 overlays the floating gate of the cell 125 to establish a flash EEPROM cell.

The column pair 120 and column pair 135 share an array virtual ground diffusion 136 (ARVSS). Thus, the source diffusion line 122 of column pair 120 is coupled to the ground diffusion 136. Similarly, the source diffusion line 137 of column pair 135 is coupled to the ground diffusion 136.

As mentioned above, each pair 120 of columns of cells shares a single metal line. Thus, a block right select transistor 138 and a block left select transistor 139 are included. The transistor 139 includes a drain in the drain diffusion line 121, a source coupled to a metal contact 140, and a gate coupled to the control signal BLTR1 on line 141. Similarly, the right select transistor 138 includes a source in the drain diffusion line 123, a drain coupled to the metal contact 140, and a gate coupled to the control signal BLTR0 on line 142. Thus, the select circuitry, including transistors 138 and 139, provides for selective connection of the first drain diffusion line 121 and a second drain diffusion line 123 to the metal line 143 (MTBL0) through metal contact 140. As can be seen, column pair 135 includes left select transistor 144 and right select transistor 145 which are similarly connected to a metal contact 146. Contact 146 is coupled to the same metal line 143 as is contact 140 which is coupled to column pair 120. The metal line can be shared by more than two columns of cells with additional select circuitry.

The architecture shown in FIG. 3 is based upon a drain-source-drain unit forming two columns of cells which are isolated from adjacent drain-source-drain units to prevent leakage current from adjacent columns of cells. The architecture can be extended to units of more than two columns, with appropriate tolerances for leakage current in the sensing circuitry, or other controls on current leakage from unselected cells. Thus, for instance, fourth and fifth diffusion lines could be added within a given isolated region to create a drain-source-drain-source-drain structure which provides four columns of cells.

Column pairs are laid out horizontally and vertically to provide an array of flash EEPROM cells comprising M word lines and 2N columns. The array requires only N metal bit lines each of which is coupled to a pair of columns of flash EEPROM cells through select circuitry, as described above.

Although the figure only shows four column pairs 120, 135, 150, and 151, coupled to two metal bit lines 143 and 152 (MTBL0-MTBL1), the array may be repeated horizontally and vertically as required to establish a large scale flash EEPROM memory array. Thus, column pairs 120 and 150 which share award line are repeated horizontally to provide a segment of the array. Segments are repeated vertically. A group of segments (e.g., eight segments) having respective word lines coupled to a shared word line driver may be considered a sector of the array.

The layout of the array is compact because of the virtual ground configuration, the reduced metal pitch requirement for the layout, and further by the ability to share word line drivers amongst a plurality of rows in different segments. Thus, word line WL63' may share a word line driver with word line WL63. In a preferred system, eight word lines share a single word line driver. Thus, only the pitch of one word line driver circuitry is needed for each set of eight rows of cells. The additional decoding provided by the left and right select transistors (139, 138 for segment 120) allows the shared word line configuration. The shared word line configuration has the disadvantage that during a sector erase operation, eight rows of cells all receive the same word line voltage, causing a word line disturbance in cells that are not desired to be erased. If it is a problem for a given array, this disturbance problem can be eliminated by insuring that all sector erase operations decode for segments including all rows of cells coupled to the shared word line drivers. For eight word lines sharing a single driver, a minimum sector erase of eight segments may be desired.

Figure 9:
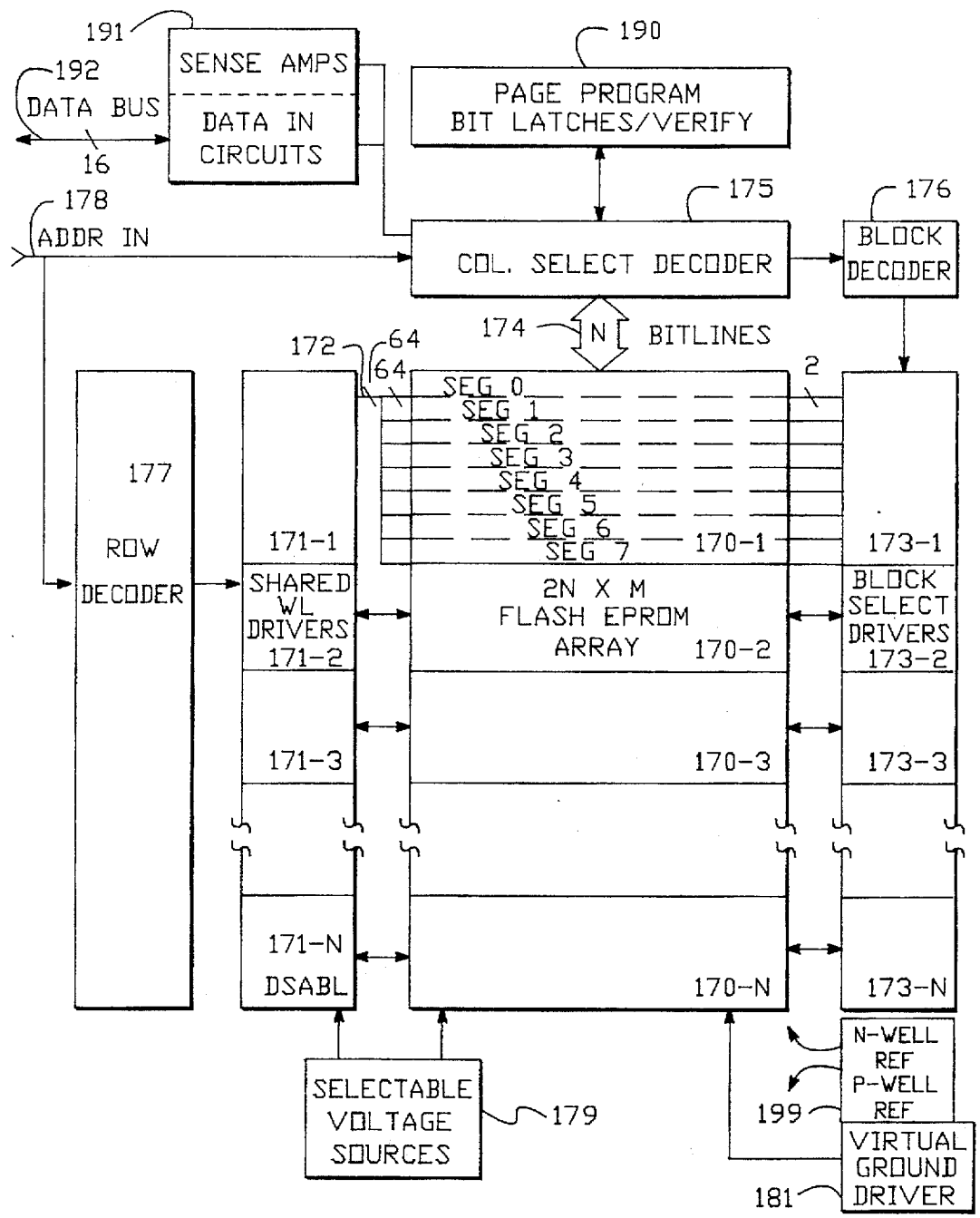
FIG. 9 is a schematic block diagram of a flash EEPROM array with page program, and automatic verify and retry circuitry according to the present invention.

FIG. 9 is a schematic block diagram of a flash EEPROM array meant to illustrate certain features of the present invention. Thus, the flash EEPROM memory module shown in FIG. 9 includes a main flash EEPROM array, including sectors 170-1, 170-2, 170-3, 170-N, each sector including eight segments (e.g., SEG0-SEG7). A plurality of sets of shared word line drivers 171-1, 171-2, 171-3, 171-N are used to drive the shared word lines of the eight segments in the respective sectors. As illustrated with respect to shared word line drivers 171-1, there are 64 shared drivers for sector 170-1. Each of the 64 drivers supplies an output on line 172. Each of these outputs is used to drive eight word lines in respective segments of the sector 170-1 as schematically illustrated in the figure by the division into eight sets of 64 lines.

Also coupled to the array are a plurality of block select drivers 173-1, 1732, 173-3, 173-N. The block select drivers each drive a left and right block select signal for each segment. Where the segments are implemented as shown in FIG. 8, there is a BLTR1 and BLTR0 block select signal pair supplied for each set of 64 word lines.

In addition, there are N global bit lines in the flash EEPROM array. The N bit lines are used to allow access to the 2N columns of flash EEPROM cells in the array for the data in circuitry and sense amps 191. The column select decoder 175 is coupled to the page program bit latches 190, including at least one bit latch for each of the N bit lines. Also, the column select decoder 175 is coupled to the data in circuitry and sense amps 191. Data bus line 192 is 16 bits wide and provides input data to the data in circuitry and sense amps 191. Data bus line 192 also provides 16 bits of output data. Together, these circuits provide data in and out circuitry for use with the flash EEPROM array.

The N bit lines 174 are coupled to a column select decoder 175. In a preferred system, N=1024 for a total of 1024 bit lines. The block select drivers 173-1 through 173-N are coupled to a block decoder 176. The shared word line drivers 171-1 through 171-N are coupled to row decoder 177. The column select decoder 175, block decoder 176, and row decoder 177 receive address signals on the address in line 178.

Coupled to the column select decoder 175 is page program bit latches/verify block 190. The page program bit latches/verify block 190 includes N latches, one for each of the N bit lines. Thus, a page of data may be considered N bits wide, with each row of cells two pages, page 0 and page 1, wide. Pages in a given row are selected using the left and right decoding described above. The page program bit latches/verify block 190 includes verify circuitry for data stored in the N bit latches and the N bits wide page of data programmed to a selected row of cells in the array. An example of this circuitry is described below.

Selectable voltage sources 179 are used to supply the reference potentials for the read, program, and erase modes for the flash EEPROM array as conceptually illustrated in the figure and described above, through the word line drivers 171-1 to 171-N and through the bit lines.

The virtual ground lines in the array are coupled to the virtual ground driver 181 providing potentials for the various modes to the virtual ground terminals in the array. Also, p-well and n-well reference voltage sources 199 are coupled to the respective wells of the array.

Thus, as can be seen in FIG. 9, the 64 word line drivers, such as word line drivers 171-1, are used with 512 (64×8) rows in the array. The additional decoding provided by the block select drivers (e.g., 173-1) allow for the shared word line layout.

The cells in the preferred embodiment are configured for a sector erase operation that causes charging of the floating gate (electrons entering the floating gate) such that upon sensing an erased cell, the cell is non-conducting and the output of the sense amp is high. Also, the architecture is configured for a page program which involves discharging a floating gate (electrons leaving the floating gate) such that upon sensing, a programmed cell is conducting.

The operation voltages for the programming operation are positive 5.5 to 6.5 volts to the drain of a cell to be programmed to a low (data=0) threshold condition, negative 8 volts to the gate, and 0 volts or floating of the source terminal. The substrate or the p-well of the cell is grounded. This results in a Fowler-Nordheim tunneling mechanism for discharging the floating gate.

The erase operation is executed by applying negative 8 volts to the source and positive 12 volts to the gate, while the drain floats. The p-well is biased at negative 8 volts. This results in a Fowler-Nordheim tunneling mechanism to charge the floating gate. The read potentials are 1.2 volts on the drain, 5 volts on the gate, and 0 volts on the source.

This sets up the ability to do a sector erase using word line decoding to select cells to be erased. The erase disturbance condition for unselected cells within a segment results in −8 volts on the drain, 0 volts on the gate, and −8 volts on the source. This is well within the tolerances of the cells to withstand these potentials without causing significant disturbance of the charge in the cell.

Similarly, the program disturbance conditions, for cells which share the same bit line in the same segment are a maximum of 6.5 volts on the drain, 0 volts on the gate (or optionally 1 volt), and 0 volts or floating on the source. There is no gate to drain drive in this condition and it does not disturb the cell significantly.

For cells which share the same word line but not the same bit line or an addressed cell which is to remain in a high condition, the disturbance condition is 0 volts on the drain, −8 volts on the gate, and 0 volts or floating on the source. Again, this condition does not result in significant deterioration of the charge in the unselected cells.

Referring to FIG. 9, the page program bit latch/verify block 190 includes program verify circuitry which involves resetting on a bit by bit basis, the data in the page buffer that passes verify.

FIG. 10 is a schematic diagram of a section of the page program and automatic verify circuitry for two bit lines MTBL0 143 and MTBL1 152. Metal line 143 (MTBL0) of FIG. 10 corresponds to metal line 143 (MTBL0) of FIG. 8. Metal line 152 (MTBL1) corresponds to metal line 152 (MTBL1) of FIG. 8. Array virtual ground 136 (ARVSS) of FIG. 10 corresponds to the array virtual ground 136 (ARVSS) of FIG. 8. The signal PWI on line 501 is coupled to the p-well of transistors 502, 504, 506, and 508. Each pair of bitlines in the array has a similar structure coupled to it.

Referring to FIG. 10, the drain of transistor 502 and the drain of transistor 504 are coupled to the metal line 143 (MTBL0). The drain of transistor 506 and the drain of transistor 508 are coupled to the metal line 152 (MTBL1). The source of transistor of 504 and the source of transistor of 506 are coupled to the array virtual ground 136 (ARVSS). Signal DMWLX on line 570 is coupled to gate of transistor 504 and gate of transistor 506. When signal DMWLX on line 570 is active, the array virtual ground line 136 (ARVSS) is coupled to the metal line 143 (MTBL0) and the metal line 152 (MTBL1) via transistor 504 and transistor 506, respectively.

Data I/O line 574 is coupled to the source of transistor 502. Data I/O line 576 is coupled to the source of transistor 508. Signal BLISOB on line 572 is coupled to the gate transistor 502 and the gate of transistor 508. When signal BLISOB is high, metal line 143 is coupled to data I/O line 574 via transistor 502, and metal line 152 is coupled to data I/O line 576 via transistor 508.

Data I/O line 574 is coupled to the drain of transistor 542. The source of transistor 542 is coupled to ground, and the gate of transistor 542 is coupled to signal DMWL on line 588. The data I/O line 574 is pulled down when the signal DMWL is high.

Data I/O line 574 is further coupled to the drain of column select transistor 544. The source of transistor 544 is coupled to node 551. The gate of transistor 544 is coupled to signal YO on line 590.

A data in buffer 550 is coupled to the source of pass gate 552. The drain of pass gate 552 is coupled to node 551. Pass gate 552 is controlled by signal DINL on line 592.

Sense amp 554 is also coupled to node 551. Sense amp 554 is controlled by signal SAEB on line 594. The output of sense amp 554 is coupled to the drain of pass gate 556. The source of pass gate 556 is coupled to latch circuit 557. Pass gate 556 is controlled by signal SARD on line 596.

The latch circuit includes inverters 558 and 560. The input of inverter 558 is coupled to the source of pass gate 556. The output of inverter 558 is coupled to the input of inverter of 560, and the output of inverter 560 is coupled to the source of pass gate 556. The output of latch circuit 557 is also coupled to a first input to NOR gate 562. A second input to NOR gate 562 is coupled to signal RESLATB on line 598. The output of NOR gate 562 is coupled to the gate of transistor 564. The drain of transistor 564 is coupled to node 551, and the source is coupled to ground.

Data I/O line 576 which is coupled through transistor 508 to bit line 152 is connected in a similar manner. Thus, line 576 is coupled to the drain of transistor 548. The source of transistor 548 is coupled to ground, and the gate is coupled to signal DMWL on line 588. The drain of transistor 546 is also coupled to data I/O line 576. Signal YO is coupled to the gate of transistor of 546. The source of transistor 546 is coupled to node DATAL 591 which corresponds to node 551 for the other side. For simplicity, a corresponding set of DIN buffer 550, sense amp 554, latch circuit 557 and associated circuits coupled to node DATA1 591 are not shown. In operation, circuits similar to buffer 550, pass gate 552, sense amp 554, pass gate 556, latch circuit 557, NOR gate 562, and transistor 564 are similarly configured and coupled to node DATAL 591.

Each data I/O line 574, 576 has a bit latch/verify logic circuit coupled to it, comprised generally of the NAND gate 524 and inverter 526 for data I/O line 574, and of NAND gate 534 and inverter 536 for data line I/O 576. For data I/O line 574, the drain of pass gate 522 is coupled to data I/O line 574, and the source of pass gate 522 is coupled to a first input of NAND gate 524. A second input to NAND gate 524 is coupled to signal BLATEN on line 582. The output of NAND gate 524 is coupled to the input of inverter 526. The input power for NAND gate 524 and inverter 526 is coupled to signal LATCHPWR on line 580. Signal LATCHB on line 578 is coupled to the gate of pass gate 522. The output of inverter 526 is coupled to the first input of NAND gate 524, the gate of transistor 510, and the gate of transistor 530. The drain of transistor 510 is coupled to signal ABLRES1 on line 577. The source of transistor 510 is coupled to ground. The drain of transistor 530 is coupled to signal DLPWR on line 586. The source of transistor 530 is coupled to the drain of transistor 528. The gate of transistor 528 is coupled to signal DLCTL on line 584, and the source of transistor 528 is coupled to data I/O line 574.

The data =1 state latched in latch circuitry 524 and 526 pulls down signal ABLRES on line 577. The logic high level enables transistor 510 which causes a logic low level on line 577. When transistor 510 is enabled, line 577 is coupled to ground which causes signal ABLRES to a logic low level. Transistors 514 and 516 comprise an inverter, which, together with transistors 510 and 512, provides a NOR logic function. Transistor 514 is a p-channel transistor with the source coupled to Vcc and the drain coupled to the drain of n-channel transistor 516. Line 577 is coupled to the drains of transistors 514 and 516. The source of n-channel transistor 516 is coupled to ground, and the gates of transistors 514 and 516 are coupled to signal PGPVB on line 599. Inverters 518 and 520 are coupled in series. Line 577 provides the input to inverter 518. The output of inverter 518 provides the input of inverter 520, and the output of inverter 520 provides signal ABLRES on line 579. Thus, whenever latch circuitry 524 and 526 stores a logic high level, signal ABLRES is a logic low level. Transistor 514 provides a pull-up to line 577 which can be driven to a logic low level by enabling either transistor 510 or transistor 512.

The purpose of transistor 516 is that during default state PGFVB on line 599 is "HIGH", and all the gates of transistors 510, 512... are low, so that if there is no transistor 516, ABLRES1 on line 577 is floating. Transistor 516 is added to help line 577 to pull low in this case. During active mode, which is program-verify period during page program mode, PGPVB on line 599 is active "LOW", transistor 516 is off and transistor 514 provides a pull-up to line 577.

A mirrored arrangement of circuits also controlled by signals LATCHB, LATCHPWR, BLATEN and DLCTL and are coupled to data I/O line 576. The drain of pass gate of 532 is coupled to data I/O line 576. The gate of pass gate 532 is coupled to signal LATCHB on line 578. The source of pass gate 532 is coupled to a first input to NAND gate 534. A second input to NAND gate 534 is coupled to signal BLATEN on line 582. The output of NAND gate 534 is coupled to the input of inverter 536. Signal LATCHPWR on line 580 provides input power to NAND gate 534 and inverter 536. The output of inverter of 536 is coupled to the first input of NAND gate 534, the gate of transistor of 512, and the gate of transistor 538. Signal DLPWR on line 586 is coupled to the drain of transistor 538. The source of transistor 538 is coupled to the drain of transistor 540. The gate of transistor of 540 is coupled to signal DLCTL on line 584, and the source of transistor 540 is coupled to data I/O line 576. The source of transistor 512 is coupled to ground and the drain of transistor 512 is coupled to line 577.

The output of latch circuitry 524 and 526 is coupled to the gate of transistor 530 and the source of transistor 522. Signal DLPWR on line 586 is coupled to the source of transistor 530. The drain of transistor 530 is coupled to the source of transistor 528. The gate of transistor 528 is coupled to signal DLCTL on line 584. The drain of transistor 528 is coupled to data I/O line 574. Transistor 530 and transistor 528 have a width of 6 microns and a length of 1.2 microns.

The drain of transistor 510 provides output signal ABLRES1 on line 577. The source of transistor 510 is coupled to ground, and the gate of transistor 510 is coupled to line 577. Thus, depending on the state of the bit latch, signal ABLRES 1 is either shorted to ground or pulled up by transmitter 514. The width of transistor 510 is 3 microns and the length is 0.8 microns.

The drain of transistor 544 is coupled to data I/O line 574, and the source is coupled to data line 650. Signal Y0 on line 590 is coupled to the gate of transistor 544 on line 590. Primary buffer 550 is coupled to data line 650. Sense amp 554 is coupled to data line 650 at node 551 and provides a control signal to the gate of transistor 564. The drain of transistor 564 is coupled to data line 650, and the source of transistor 564 is coupled to ground. Thus, depending on the output of sense amp 554, transistor 564 couples data line 650 to ground.

In operation, the page program and automatic verify circuit of the flash EEPROM array as shown in FIG. 10 executes the page program and program verify in a series of stages. The stages can be generalized as a (1) data loading stage; (2) data program stage; (3) read the array data stage; (4) reset bit latch stage; and (5) retry stage. The operation of the page program and automatic verify of the flash EEPROM array is described with reference to data I/O line 574. Page program and automatic verify are similarly performed using data I/O line 576 that is coupled to another memory cell. Furthermore, the page program and automatic verify circuit includes similar circuitry for all data I/O lines needed to program a page of memory cells in the flash EEPROM array.

In the data loading stage, signal LATCHPWR on line 580, signal LATCHB on line 578, and signal BLATEN on line 582 are supplied with 5 volts to activate data latch circuitry 524 and 526 for operation. Signal LATCHPWR on line 580 supplies voltage to NAND gate 524 and inverter 526 for operation. Signal BLATEN on line 582 enables latch circuitry 524 and 526 to receive inputs. Signal LATCHB on line 578 enables pass gate 522 to couple data I/O line 574 with the first input of NAND gate 524. Signal BLISOB on line 572 is at a logic low level which disables transistor 502. Disabling transistor 502 isolates data I/O line 574 from the metal line 143 (MTBL0). Signal DLCTL on line 584 is at a logic low level which disables pass gate 528. Signal DLPWR is at a logic high level having a voltage of Vcc that is approximately 5 volts. Signal DMWL on line 588 is at a logic low which prevents transistor 542 from coupling data I/O line 574 to ground. Signal Y0 on line 590 is a logic high level which enables transistor 544 to conduct. Signal Y0 is a decoded signal which enables data I/O line 574 to access a corresponding one of 16 DIN buffers (e.g. buffer 550) during the data loading stage. Signal DINL on line 592 is a logic high which enable pass gate 552. Input data from DIN buffers 550 is transferred via pass gate 552 to data I/O line 574.

Once input data is transferred to data I/O line 574, the data from DIN buffer 550 is transferred to the first input of NAND gate 524. If data from DIN buffer 550 is a logic high level, the logic high level received at the first input of NAND gate 524 causes a logic low output. The logic low output of NAND gate 524 provides the input to inverter 526 which provides a logic high output. NAND gate 524 and inverter 526 comprise the bit latch circuitry 524 and 526 which latches the data received at the first input of NAND gate 524. The logic high level at the output of inverter 526 enables pass gate 530 and transfers signal DLPWR on line 586 to pass gate 528. However, during the data loading stage, signal DLCTL on line 584 is a logic low which disables pass gate 528 from conducting signal DLPWR to data I/O line 574.

In the other case, when data from DIN buffer 550 is a logic low level, the logic low level received at the first input of NAND gate 524 causes a logic high output. The logic high output of NAND gate 524 provides the input to inverter 526 which provides a logic low output that is stored in latch circuitry 524 and 526. The logic low at the output of inverter 526 disables pass gate 530 and the transfer of signal DLPWR on line 586 via pass gate 528 to data I/O line 574. Thus, the bit latch circuit of NAND gate 524 and inverter 526 stores either the logic high level or the logic low level of the input data which corresponds to the data transferred from DIN buffer 550.

The bit latches for the entire page of 1024 bits are loaded 16 bits at a time. Once the input data from DIN buffers 550 is loaded into bit latch circuitry 524 and 526 after execution of the data loading stage for all bit lines, a verify sequence is executed followed by the data write stage. The pre-writing verify loop (according to the sequence described below) prevents over-programming cells into depletion such as if no pre-erase is executed and a user programs the page with the same data twice. A data write occurs when a logic high is stored in the latch circuitry 524 and 526. When a logic high level data =1 state is received from DIN buffer 550, the logic high level is programmed to a cell of the flash EEPROM array during the data write stage. If a logic low level (data=0) is received from DIN buffer 550 and stored in latch circuitry 524 and 526, the data write stage does not program the memory cell of the flash EEPROM.

In the present example, a logic high level (data =1) is transferred from DIN buffer 550 and stored in bit latch circuitry 524 and 526. During the execution of the data write stage, signal LATCHB on line 578 is disabled. Signal LATCHB on line 578 is set to a logic low to disable inputs to latch circuitry 524 and 526. Signal LATCHPWR is set to a high voltage to provide power to latch circuitry 524 and 526. Signal BLATEN on line 582 is set to a high voltage level to enable the output of latch circuitry 524 and 526. Signal BLISOB on line 572 is set to a high voltage level to enable transistor 502 and set to the appropriate value for controlling program pulse height. Transistor 502 couples data I/O line 574 to metal line 143. Signal DLCTL on line 584 is set to a high voltage level to enable pass gate 528. Signal DLPWR on line 586 is set to a high voltage (about 9 volts). Signal YO on line 590 is a logic low level to disable transistor 544. Signal DINL is a logic low level which decouples input data from DIN buffer 550 from data I/O line 574. Signal SAEB is a logic low level to disable sense amp 554.

Once the control signals are properly initialized to perform the data program stage, signal DLPWR on line 586 is transferred to data I/O line 574. Signal DLPWR provides programming power to program a memory cell in the flash EEPROM array. Thus, if latch circuitry 524 and 526 is latched with a data =1 state, pass gate 530 is enabled to permit signal DLPWR to pass through pass gate 528. Signal BLISOB on line 572 enables transistor 502 and couples signal DLPWR to the metal line 143 (MTBLO) with appropriate pulse height.

Referring to FIG. 8, enabling signal BLTR1 on line 141 or BLTR0 on line 142 couples a column of cells to the metal line 143 and provides the programming voltage from signal DLPWR to program a particular memory cell 125 or 129 on the word line which is changed to −8 volts. For instance, if BLTR1 on line 141 is selected and word line WL1 is selected, the programming voltage from signal DLPWR is directed to memory cell 125.

After the data from latch circuitry 524 and 526 is programmed to the memory cell, the circuitry is ready to verify automatically that the data was properly programmed in the data write stage. This involves a five step sequence (A through E) for deciding whether to reset the bit latch as follows:

Step A

READ the real data from the non-volatile bit through the associated sense amp (all 16 sense amps are activated at the same time, i.e. 16 bits are read at the same time). The sensing result is stored in latch 557 of FIG. 10. For example, in FIG. 10, to verify a selected cell from a specified wordline, BLISOB (572) must be high (ON), selected Y (544, 546 and 14 more of such devices) is on, sense amp (SA) 554 is activated (and 15 other SA), SARD (596) is high to allow the sensing result pass to the latch (557) and LATCHB (578), DLCTL (584) are at low voltage (OFF) so that during this READ step, the bit latch consisting of 524 and 526 will not be disturbed. The selected cell threshold voltage is sensed by the SA (554) via data line 574 and then stored in latch 557, after a certain amount of time which is long enough for the SA (554) to do the sensing. If after programming, the cell's threshold voltage (VT) is low enough (to the point that the SA 554 can tell that the cell is at low VT state) then the output of the inverter (560, or input of 558) will reflect a low level, SARD (596) is off and then SA (544) is disabled. The low level is stored in latch (557), no matter what read happens during the next 4 steps in sequence until the new locations need to be read again. If after programming, the selected cell VT is still read high, then the output of inverter 560 is at high level, i.e. a logic high level is latched in latch 557. Note that RESLATB (598) is HIGH in this step so that whether latch 557 latched high or low will not affect device (564) because device 564 is OFF anyway.

Step B

DISCHARGE DATA LINES (all including selected and deselected) The purpose of this step will be explained in STEP D). The way of discharging the data line 574 is by activating DMWL (588) to high, LATCHB at low, DLCTL at low, with all sense amps disabled, 564 and 552 are off. Transistor 588 discharges charge stored in data line 574. BLISOB (572) is at low level to isolate the long metal-bit-line (MTBL0) from the data line (574) so that the discharge sequence can be achieved faster.

Step C

PRE-CHARGE DATA LINES (selectively, according to the associated bit latch) The purpose of this step will be explained in step D.) During this step, DMWL is at low level, BLISOB is still at low level, whether the selected 16 data lines of the same word and other de-selected data lines should be precharged to a high voltage level or not is decided by the data which is stored in the bit latch. For example, in FIG. 10, during this step LATCHB (578) is still off, DLCTL (584) is switched from low to high, and data line 574 is precharged to a high level by connecting DLPWR (a $V_{cc}$ level power source for this instance) to the data line (574) via devices 530 and 528 if the output of inverter 526 (which is the gate of 530) is latched at HIGH level. Otherwise DLPWR cannot precharge data line 574 to a high level and the data line 574 should be still at a low voltage level due to step B)

Step D

RESET BIT LATCH OR NOT? During this step LATCHB (578) is switched from low level to a high level, and RESLATB (598) switches from high to low in order to reset bit latch (which consists of inverter 524 and 526) by turning on 564, if the output of inverter 560 is (latched) low (from step A). Since the selected cell is at low VT already, the bit latch content shall be reset so that for the next programming, high voltage pulse sequence, the cell which is at low VT shall not be programmed to low VT again. There is a chance that the bit latch had been reset from a previous verify loop step D) or was at reset state even before the first programming sequence. In these cases, the subsequent reset bit latch step is of no effect to the bit latch for the former case; and for the latter case whether the selected cell is at high VT or not will not affect the bit latch because that if the cell is at high VT, there is no resetting the bit latch (564 is OFF, from Steps A and D) and bit latch was at reset state. If the cell was at low VT, then resetting the bit latch again makes no difference to the contents of the bit latch. There is no comparison circuit needed in this implementation.

Note that LATCHB is a global signal to all the bit latches in the flash EEPROM design and the high level at the gates of 522, 532 ... results in all bit latches talking to the associated data lines which means that the node of the output of inverter 526 will encounter a charge sharing with the associated data line (574, for example). The driving capability of inverter 526 is designed to be a weak device in order that a proper data can be set (to fight against inverter 526)

into the bit latch. So when LATCHB (528) is HIGH, weak inverter (526) suffers a charge sharing issues which results in the uncertainty of the integrity of the bit latch.

The purpose of steps B) and C) is to put the proper voltage level at the data lines before getting into step D), i.e. before LATCHB (578) switches from low to high to avoid any "charge sharing issues", even though the circuitry can be designed as mentioned above to ensure proper operation without them. During step B), all data lines are discharged to low level and then at step C) only those data lines whose associated bit latches "stored" high level will be precharged to a high level. Thus steps B) and C) are optional steps inserted here for safety in the design.

Step E

DISCHARGE ALL DATA LINES AGAIN. At this moment, the programm verify activity is pretty much done, before moving into the next word for programming-verifying (or more precisely, to change the new word and repeat from step A) to step D)),the logic control will remove residue charges from all the data lines and switch to new word. For example, during this step, LATCHB (578) is at LOW level, RESLATB (598) is at HIGH level, DMWL (598) is at HIGH level and BLISOB (572) is at HIGH level.

Thus, the page program and automatic verify circuit of the present invention provides the unique feature of automatically verifying a memory cell that is programmed. Latch circuitry 524 and 526 stores the input data received from DIN buffer 550. The stored data in latch circuitry 524 and 526 controls ABLRES1 which is set to a logic low level if there is one or more than one of the cells which need to be programmed. Signal ABLRES1 remains a logic low level until the memory cell is verified during the program verify sequence which resets latch circuitry 524 and 526 to a logic low level and resets signal ABLRES 1 to a logic high level indicating a properly programmed memory cell. The program verify sequence is automatic.

Signal PGPVB on line 599 is a logic low level to supply a charge to line 577 during automatic verify sequence. When latch circuitry 526 and 524 is reset, transistor 510 is disabled and the charge on line 577 is no longer discharged to ground. Signal ABLRES1 on line 577 becomes a logic high level. The logic high level provides an input to inverter 518 which produces an output that provides an input to inverter 520 which provides the logic high level output of signal ABLRES on line 579. The logic high level of signal ABLRES on line 579 provides a page programmed verify signal signifying the page of memory cells has passed program verify.

Each memory cell within a page of memory cells in the array is able to activate a transistor 510 to cause signal ABLRES1 on line 577 to a low level. Thus, any memory cell that does not pass program verify within a page of memory cells in the array can cause the output ABLRES to be a logic low level. The logic low level of ABLRES on line 579 signals that at least one memory cell within the page of memory cells in the array is not properly programmed and verified. Thus, any memory cell not properly verified can cause signal ABLRES on line 579 to be a logic low level. When all memory cells are properly programmed and verified, signal ABLRES on line 579 is a logic high level.

In operation, unsuccessfully programmed memory cells are reprogrammed and reverified until signal ABLRES becomes a logic high level. The number of retries are limited to prevent looping of the programming sequence if a page repeatedly fails program verification.

Figure 11:
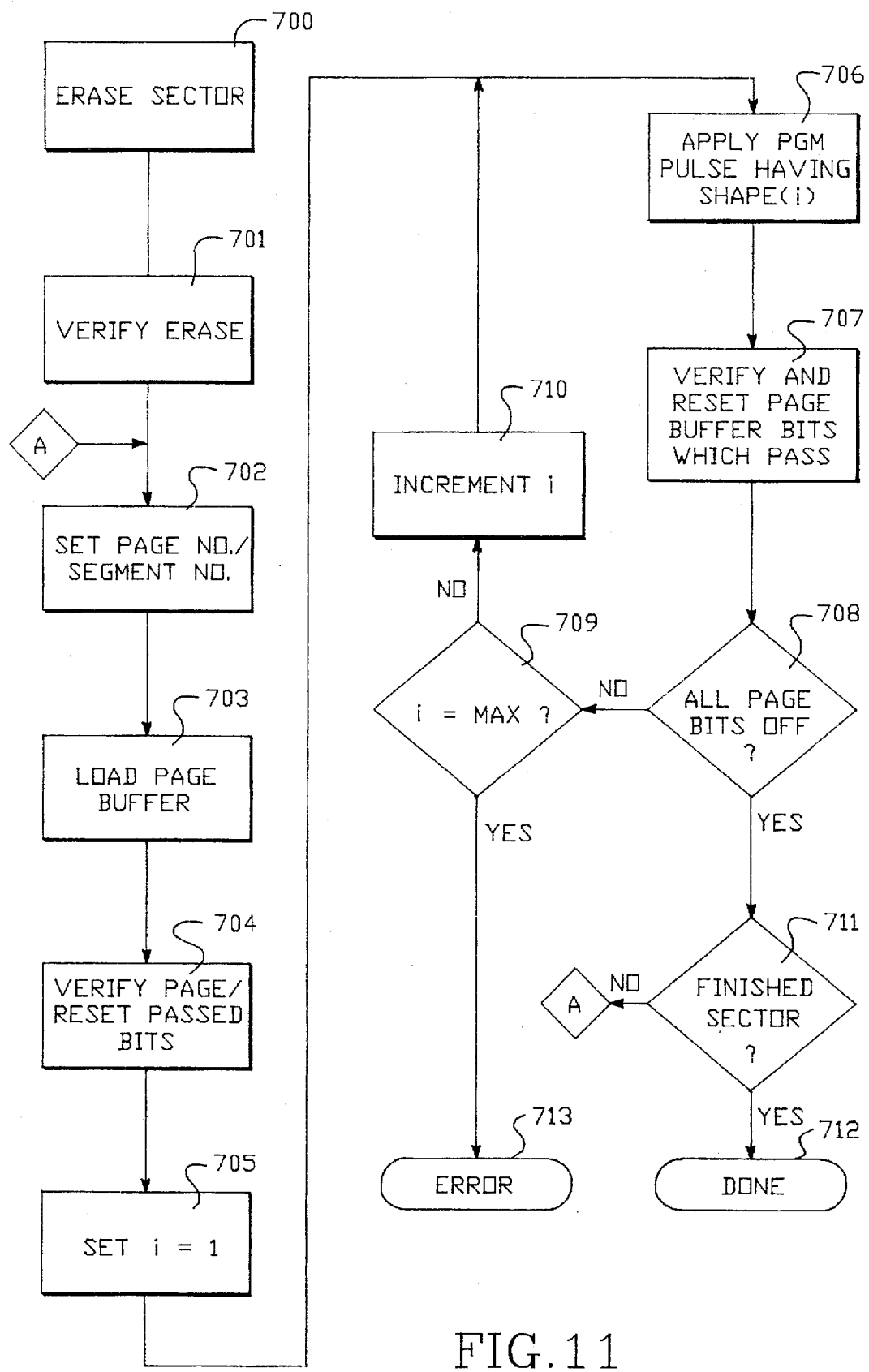
FIG. 11 illustrates a flow chart of a page program and automatic verify operation according to the present invention using a retry pulse shape pattern.

FIG. 11 provides a flow chart illustrating the program flow for the flash EEPROM circuit of FIG. 8. The process begins by erasing the sector (e.g., sector 170-1) into which data is to be programmed (block 700). After erasing the sector, an erase verify operation is executed (block 701). Next, the page number, either 0 or 1, and the segment number, 1–8, is set by the host processor in response to the input address (block 702).

After setting the page number and segment number, the page buffer is loaded with the data for the page (block 703). This page buffer may be loaded with an entire N bits of data, or a single byte of data, as suits a particular program operation. Next, a verify operation is executed, in case the user does not pre-erase or tries to reprogram the same data, to determine which cells need programming (block 704). After the initial verify in block 704, the algorithm proceeds to set up the program retry pattern by setting an index "i" to 1 (block 705). A program pulse is then applied as described above with reference to FIG. 10, where the pulse has a shape defined by the index "i" (block 706). As mentioned above, this shape is controlled in both pulse height and pulse width according to patterns selected for the particular implementation as described above. After program pulse having shape "i", the algorithm verifies and resets page buffer bits which pass (block 707). After the verify loop, the algorithm, determines whether all page bits in the buffer have been reset (block 708). If they have not, then the algorithm determines whether the maximum number of retries has been executed by testing the index "i" (block 709). If it has not reached the maximum, then "i" is incremented (block 710) and the algorithm loops back to block 706 to apply the next program pulse have the next shape in the retry pattern. The algorithm loops in this manner until all page bits in the page buffer have been turned off. At this point, at block 708 the algorithm branches to block 711 where it determines whether the sector being programmed has been finished. If it has been finished, then the algorithm is done. If it has not been finished, then the algorithm loops to point A as indicated in the figure, which places it back at block 702 to set the page number and segment number of the next page to be programmed.

If the page is not successfully programmed after the maximum number of retries, then the test at block 709 will detect this condition and indicate an error (block 713). The algorithm is done at block 712.

Accordingly, a new programming technique and new flash EEPROM cell and array architecture have been provided. The architecture provides for a very dense core array obtained by unique cell layouts, where two adjacent local drain bit lines share one common source bit line. Also, the layout has been optimized to allow use of a single metal line for every two columns of cells in the array.

Further, the layout is further reduced by shared word lines, so that the word line driver pitch does not impact the size of the main array. Sector erase is feasible using segmentable architecture of the present invention. Also, the page program and automatic verify circuitry provides efficient and accurate programming of the memory cells. Thus, a high performance, reliable flash memory array can be achieved using these technologies.

Using the variable pulse height and pulse width pulse pattern for program retries, substantially increases the performance of the flash EEPROM array. In particular, overprogramming is reduced, average programming timing is increased, disturbance of unselected cells is limited, and fewer dye must be discarded because of too slow or too fast programming cells in the array. As the state of the art in critical dimensions shrinks the features of integrated circuits, variations in the critical dimensions result in wider and wider variations in programming speed of floating gate cells. The algorithm of the present invention provides a substantial improvement in performance critical as design rules drive features of transistors in the array to one third micron and below.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for programming a floating gate memory cell, comprising:

applying a first program pulse to the cell having a first pulse height and a first pulse width selected so that the cell is unlikely to be over-programmed;

determining whether the cell is programmed in response to the first program pulse; and if not applying a program retry pulse to the cell;

determining whether the cell is programmed in response to the program retry pulse; and if not iteratively applying another program retry pulse to the cell and determining whether the cell is programmed, until the cell is determined to be programmed or a maximum number of retries is made;

wherein the program retry pulses have respective pulse widths and pulse heights which vary according to a pattern which includes at least one pulse having pulse width wider than the first pulse width and a pulse height higher than the first pulse height, the pattern selected so that the cell is likely to be programmed within a first phase of the pattern including predetermined number of retries less than the maximum number of retries.

2. The method of claim 1, wherein retry pulses in the pattern have respective energies determined by the respective pulse heights and widths, and the respective energies of the pulses successively remain constant or increase during the first phase of the pattern.

3. The method of claim 2, wherein the pulse height during the first phase is constant and greater than the first pulse height, and the pulse width during the first phase successively increases.

4. The method of claim 3, wherein the pulses after the first phase have energies greater than a final pulse of the first phase.

5. The method of claim 1, wherein the floating gate cell has a control gate, a source and a drain, and the first program pulse and program retry pulses are generated by supplying a negative voltage to the control gate and a variable voltage to the drain, such that Fowler-Nordheim tunneling is induced to discharge the floating gate cell.

6. An apparatus for storing data, comprising:

a memory array having a plurality of floating gate cells;

supply circuits, coupled to the memory array, which apply voltages to the plurality of floating gate cells to program the plurality of floating gate cells in the memory cells;

a plurality of bit latches, coupled to bit lines in the memory array, which bit latches provide a buffer for temporary storage of sata values to be programmed at least a portion of a row of floating gate cells in the memory array; and automatic program circuits, coupled to the memory array, the supply circuits and the plurality of bit latches, which program cells on a selected wordline and on bit lines coupled to a bit latch storing a program value, including circuitry to apply a first program pulse having a first pulse height and a first pulse width set so that the cells are unlikely to be over-programmed;

to determine whether the cell is programmed in response to the first program pulse; and if it is, to reset the corresponding bit latch, and if it is not to apply a program retry pulse to the cell;

to determine whether the cell is programmed in response to the program retry pulse; and if it is, to reset the corresponding bit latch and if it is not to interatively apply another program retry pulse to the cell, determine whether the cell is programmed and reset bit latches of programmed cells, until all bit latches in the plurality of bit latches are reset or a maximum number of retries is made;

wherein the cell is programmed and reset bit latches of programmed cells, until all bit latches in the plurality of bit latches are reset or a maximum number of retries is made;

wherein the program retry pulses have respective pulse widths and pulse heights which vary according to a pattern which includes at least one pulse having pulse width wider than the first pulse width and a pulse height higher than the first pulse height.

7. The apparatus of claim 6, wherein each row of pluarlity of floating gate cells includes a first page and second page; and the plurality of bit latches include a page of data to be programmed to the floating gate cells.

8. The apparatus of claim 6, wherein:

the memory array includes at least M word lines and at least N bit lines coupled to the plurality of floating gate cells; and the plurality of bit latches includes one bit latch for each of the N bit lines; where N is greater than 32.

9. The apparatus of claim 8, wherein the pattern is selected so that the cells are likely to be programmed within a first phase of the pattern including predetermined number of retries less than the maximum number of retries, and N is greater than 500, and the first phase of the pattern is completed in less than one millisecond.

10. The apparatus of claim 9, wherein N is greater than 1000.

11. The apparatus of claim 6, wherein the pattern is selected so that the cells are likely to be programmed within a first phase of the pattern including predetermined number of retries less than the maximum number of retries, and retry pulses in the pattern have respective energies determined by the respective pulse heights and widths, and the respective energies of the pulses successively remain constant or increase during the first phase of the pattern.

12. The apparatus of claim 11, wherein the pulse height during the first phase is constant and greater than the first pulse height, and the pulse width during the first phase successively increases.

13. The apparatus of claim 11, wherein the pulses after the first phase have energies greater than a final pulse of the first phase.

14. The apparatus of claim 6, wherein the first program pulse and program retry pulses are generated by supplying a negative voltage to the selected wordline and a variable voltage to the bitline, such that Fowler-Nordheim tunneling is induced to discharge the floating gate cell.

15. A method of storing data in a memory array on an integrated circuit having M rows and N columns of floating gate memory cells comprising the steps of:

loading a page buffer on the integrated circuit with a row of input data;

selecting a row of memory cells for programming the input data to the row of memory cells;

applying a first program pulse to cells in the row of memory cells corresponding to input data having a program value in the page buffer;

reading the row of memory cells to verify programming of the input data to the row of memory cells;

resetting the input data in the page buffer of successfully verified memory cells in the row of memory cells; and if data having a program value remains in the page buffer, then applying a program retry pulse to the cells in the row of memory cells corresponding to input data having a program value in the page buffer;

reading the row of memory cells to verify programming of the input data to the row of memory cells; and resetting the input data in the page buffer of successfully verified memory cells in the row of memory cells; and if data having a program value remains in the page buffer, then alternatively applying another program retry pulse to the cell and reading and resetting the input data for programmed cells, until the row is determined to be programmed or a maximum number of retries is made;

wherein the program retry pulses have respective pulse widths and pulse heights which vary according to a pattern which includes at least one pulse having pulse width wider than the first pulse width and a pulse height higher than the first pulse height.

16. The method of claim 15, further comprises the step of selecting a subset of the N columns in the row of memory cells for programming the input data.

17. The method of claim 15, wherein the step of programming the row memory cells includes the step of changing charge states stored in the floating gate memory cells when a data program state is stored in the page buffer.

18. The method of claim 15, wherein the pattern is selected so that the cells are likely to be programmed within a first phase of the pattern including predetermined number of retries less than the maximum number of retries, retry pulses in the pattern have respective energies determined by the respective pulse heights and widths, and the respective energies of the pulses successively remain constant or increase during the first phase of the pattern.

19. The method of claim 18, wherein the pulse height during the first phase is constant and greater than the first pulse height, and the pulse width during the first phase successively increases.

20. The method of claim 18, wherein the pulses after the first phase have energies greater than a final pulse of the first phase.

21. The method of claim 15, wherein the floating gate cells have a control gate, a source and a drain, and the first program pulse and program retry pulses are generated by supplying a constant negative voltage to the control gate and a variable voltage to the drain, such that Fowler-Nordheim tunneling is induced to discharge the floating gate cells.

22. The method of claim 15, wherein:

the memory array includes at least M word lines and at least N bit lines coupled to the plurality of floating gate cells; and the page buffer includes one bit latch for each of the N bit lines; where N is greater than 32.

23. The method of claim 22, wherein the pattern is selected so that the cells are likely to be programmed within a first phase of the pattern including predetermined number of retries less than the maximum number of retries, and N is greater than 500, and the first phase of the pattern is completed in less than one millisecond.

24. The method of claim 23, wherein N is greater than 1000.

* * * * *